US009786511B2

(12) United States Patent
Darling et al.

(10) Patent No.: US 9,786,511 B2
(45) Date of Patent: *Oct. 10, 2017

(54) SEQUENTIAL INFILTRATION SYNTHESIS FOR ADVANCED LITHOGRAPHY

(71) Applicant: UChicago Argonne LLC, Chicago, IL (US)

(72) Inventors: Seth B. Darling, Chicago, IL (US); Jeffrey W. Elam, Elmhurst, IL (US); Yu-Chih Tseng, Westmont, IL (US); Qing Peng, Downers Grove, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/645,162

(22) Filed: Mar. 11, 2015

(65) Prior Publication Data
US 2015/0255298 A1    Sep. 10, 2015

Related U.S. Application Data

(62) Division of application No. 13/427,619, filed on Mar. 22, 2012, now Pat. No. 8,980,418.

(Continued)

(51) Int. Cl.
*H01L 21/027*  (2006.01)
*H01L 21/308*  (2006.01)
(Continued)

(52) U.S. Cl.
CPC .......... *H01L 21/3081* (2013.01); *G03F 7/405* (2013.01); *H01L 21/0273* (2013.01);
(Continued)

(58) Field of Classification Search
CPC ............. H01L 21/3081; H01L 21/0274; H01L 21/0279; H01L 21/0277; H01L 21/3086;
(Continued)

(56) References Cited

U.S. PATENT DOCUMENTS 6,162,591 A * 12/2000 Gao .......................... G03F 7/38
430/323
7,163,641 B2    1/2007 Donohoe et al.
(Continued)

FOREIGN PATENT DOCUMENTS

WO    WO-2008/135749    11/2008

OTHER PUBLICATIONS

US Office Action for U.S. Appl. No. 13/209,190, mailed Apr. 6, 2016, 14 pages.
(Continued)

*Primary Examiner* — Anita Alanko
(74) *Attorney, Agent, or Firm* — Foley & Lardner LLP

(57) ABSTRACT

A plasma etch resist material modified by an inorganic protective component via sequential infiltration synthesis (SIS) and methods of preparing the modified resist material. The modified resist material is characterized by an improved resistance to a plasma etching or related process relative to the unmodified resist material, thereby allowing formation of patterned features into a substrate material, which may be high-aspect ratio features. The SIS process forms the protective component within the bulk resist material through a plurality of alternating exposures to gas phase precursors which infiltrate the resist material. The plasma etch resist material may be initially patterned using photolithography, electron-beam lithography or a block copolymer self-assembly process.

20 Claims, 26 Drawing Sheets

Related U.S. Application Data

(60) Provisional application No. 61/467,166, filed on Mar. 24, 2011.

(51) Int. Cl.

| | |
|---|---|
| *H01L 21/3065* | (2006.01) |
| *G03F 7/40* | (2006.01) |
| *G03F 7/004* | (2006.01) |
| *B82Y 40/00* | (2011.01) |
| *B81C 1/00* | (2006.01) |

(52) U.S. Cl.
CPC ...... *H01L 21/0274* (2013.01); *H01L 21/0277* (2013.01); *H01L 21/0279* (2013.01); *H01L 21/3065* (2013.01); *H01L 21/3086* (2013.01); *B81C 1/00428* (2013.01); *B81C 2201/0149* (2013.01); *B82Y 40/00* (2013.01); *G03F 7/0041* (2013.01); *Y10T 428/31522* (2015.04)

(58) Field of Classification Search
CPC . H01L 21/3065; H01L 21/0273; G03F 7/405; G03F 7/0041; B81C 2201/0149; B81C 1/00428; B82Y 40/00; Y10T 428/31522
See application file for complete search history.

(56) References Cited

U.S. PATENT DOCUMENTS

| | | | |
|---|---|---|---|
| 7,399,709 B1 | 7/2008 | Lin et al. | |
| 8,900,467 B1* | 12/2014 | Chapuis | G03F 7/0002 216/41 |
| 8,986,562 B2* | 3/2015 | Zafiropoulo | H01L 21/0273 216/48 |
| 9,416,447 B2* | 8/2016 | Arora | C23C 16/45525 |
| 9,487,600 B2* | 11/2016 | Darling | C08F 8/42 |
| 2005/0103748 A1* | 5/2005 | Yamaguchi | H01L 21/31116 216/67 |
| 2006/0231525 A1 | 10/2006 | Asakawa et al. | |
| 2009/0101985 A1 | 4/2009 | Fuller et al. | |
| 2009/0181171 A1 | 7/2009 | Cheng et al. | |
| 2010/0092873 A1 | 4/2010 | Sills et al. | |
| 2010/0248476 A1* | 9/2010 | Sera | H01L 21/0337 438/669 |
| 2011/0206905 A1 | 8/2011 | Buriak et al. | |
| 2012/0046421 A1 | 2/2012 | Darling et al. | |
| 2012/0241411 A1 | 9/2012 | Darling et al. | |
| 2013/0157409 A1* | 6/2013 | Vaidya | H01L 31/18 438/98 |

OTHER PUBLICATIONS

US Office Action for U.S. Appl. No. 13/902,169, mailed Mar. 24, 2016, 16 pages.
Office Action for U.S. Appl. No. 13/902,169, mail date Oct. 11, 2016, 14 pages.
Amirtharaj et al. "Double Patterning and Hyper-Numerical Aperture Immersion Lithography" via http://www.ece.umd.edu/class/enee416/GroupActivities/Lithography%20Presentation.pdf; Nov. 17, 2011, 16 pages.
Baravelli, et al., VDD Scalability of FinFet SRAMS: Robustness of Different Design Options Against LER-induced Variations, Solid-State Electronics (Sep. 2010) pp. 909-918, vol. 54, Elsevier Ltd.
Chai, Jinan, Ordering Functional Nanostructures via Self-Assembly of Block Copolymers; University of Alberta, Spring 2009, 196 pages.
Diaz, et al., An Experimentally Validated Analytical Model for Gate Line-Edge Roufhness (LER) Effects on Technoloyg Scaling, IEEE Electron Device Letters (Jun. 2001), pp. 287-289, vol. 22, No. 6.
Dreeskornfeld, et al., High Precision Etching of Si/SiO2 on a High-Density Helicon Etcher for Nanoscale Devices, Journal of the Electrochemical Society, available electronically Sep. 19, 2003, pp. G702-G706, vol. 150, The Electrochemical Society.
Endo, et al., High Sensitive Negative Silylation Process for 193nm Lithography, Microelectronic Engineering, (Jun. 2000), pp. 485-488, vol. 53, Elsevier Science B.V.
Final Office Action on U.S. Appl. No. 13/427,619 dated Aug. 13, 2014, 22 pages.
Frase, et al., CD Characterization of Nanostructures in SEM Metrology, Meas. Sci. Technol. (Jan. 12, 2007), pp. 510-519, vol. 18, IOP Lublishing Ltd., UK.
Goldfarb, et al., Effect of Thin-Film Imaging on Line Edge Roughness Transfer to Underlayers During Etch Processes, J. Vac. Sci. Technol. (Mar./Apr. 2004), pp. 647-653, vol. B22(2), American Vacuum Society.
Hartney, et al., Silylation Processes for 193-nm Excimer Laser Lithography, Advances in Resist Technology and Processing VI (Jun. 1, 1990), pp. 119-130, vol. 1262, SPIE.
Hutton, et al, Application of Plasmask® Resist and the DESIRE Process to Lithography at 248 nm, J. Vac. Sci. Technol. (Nov./Dec. 1990), pp. 1502-1508, vol. 8, No. 6, American Vacuum Society.
Kontziampasis, et al., Optimized Surface Silylation of Chemically Amplified Expoxidized Photoresists for Micromachining Applications, Journal of Applied Polymer Science, (Aug. 15, 2010), pp. 2189-2195, vol. 117, Wiley Periodicals, Inc.
Lee, et al., Mobility Analysis of Surface Roughness Scattering in FinFET Devices, Solid-State Electronics, Aug. 2011, pp. 195-201, vol. 62, Elsevier Ltd.
Lopes, et al., "Hierarchical Self-Assembly of Metal Nanostructures on Diblock Copolymer Scaffolds", Nature (Dec. 13, 2001), pp. 735-738, vol. 414, Macmillan Magazine.
Lucas et al. "Triple patterning in 10 nm mode metal lithography" http://spie.org/x91233.xml ; Nov. 26, 2012, 3 pages.
Luo, Optical Characterization and Process Control of Top Surface Imaging, Mat. Res. Soc. Symp. Proc., (Fall 1999), pp. 183-188, vol. 584, Materials research Society.
Ma, et al., Line Edge Roughness of Sub-100 nm Dense and Isolated Features: Experimental Study, J. Vac. Sci. Technol. (Nov./Dec. 2003), pp. 3124-3130, vol. 21, No. 6, American Vacuum Society.
Mori, et al., Reduction of Line Edge Roughness in the Top Surface Imaging Process, J. Vac. Sci. Technol., (Nov./Dec. 1998), pp. 3739-3743, vol. 16, No. 6, American Vacuum Society.
Non-Final Office Action for U.S. Appl. No. 13/209,190, dated Sep. 21, 2015, 13 pages.
Non-Final Office Action on U.S. Appl. No. 13/209,190, dated Oct. 16, 2013, 10 pages.
Non-Final Office Action on U.S. Appl. No. 13/427,619, dated Mar. 11, 2014, 21 pages.
Non-Final Office Action on U.S. Pat. Appl. No. 13/902,169, dated Aug. 25, 2014, 12 pages.
Notice of Allowance for U.S. Appl. No. 13/427,619, dated Dec. 1, 2014, 9 pages.
Oehrlein, et al., Plasma-polymer Interactions: A review of Progress in Understanding Polymer Resist Mask Durability During Plasma Etching for Nanoscale Fabrication, J. Vac. Sci. Technol. (Jan./Feb. 2011), pp. 010801-1-010801-35, vol. 29, No. 1, American Vacuum Society.
Office Action for U.S. Appl. No. 13/209,190, dated Jun. 10, 2015, 12 pages.
Office Action for U.S. Appl. No. 13/209,190, dated May 1, 2014, 10 pages.
Office Action for U.S. Appl. No. 13/209,190, dated Nov. 24, 2014, 13 pages.
Office Action for U.S. Appl. No. 13/902,169, dated May 18, 2015, 17 pages.
Olynick, et al., 25 nm Mechanically Buttressed High Aspect Ration Zone Plates: Fabrication and Performance, J. Vac. Sci. Technol. (Nov./Dec. 2004), pp. 3186-3190, vol. 22, No. 6, American Vacuum Society.
Park, et al., "Block Copolymer Lithography: Periodic Arrays of 10-11, Holes in 1 Square Centimeter", Science, (May 30, 1997) Science vol. 276, pp. 1401-1404.
Peng, et al., A Route to nanoscopic Materials via Sequential Infiltration Synthesis on Block Colpolymer Templates, ACS Nano (May 2011), pp. 4600-4606, vol. 5, No. 6.

(56) References Cited

OTHER PUBLICATIONS

Peng, et al., Nanoscopic Patterned Materials with Tunable Dimensions via Atomic Layer Deposition on Block Copolymers, Advanced Materials (Dec. 1, 2010), pp. 5129-5133, vol. 22, Material Views.
Pierrat, et al., PRIME Process for Deep UV and e-beam Lithography, Microelectronic Engineering (Apr. 1990), pp. 507-514, vol. 11, Elsevier Science Publishers B.V.
Poirier, et al., Two-Dimensional Liquid Phase and the p×√3 Phase of Alkanethiol Self-Assembled Monolayers on Au(111), Langmuir (Oct. 1, 1994), pp. 3383-3386, vol. 10, American Chemical Society.
Ras, et al., "Hollow Inorganic Nanospheres and Nanotubes with Tunable Wall Thickness by Atomic Layer Deposition on Self-Assembled Polymeric Templates", Advanced Materials (Jan. 2007), pp. 102-106, vol. 19, VCH Verlag GmbH & Co. KGaA, Weinheim.
Rio, et al., Study on Line Edge Roughness for Electron Beam Acceleration Voltages from 50 to 5 kV, J. Vac. Sci. Technol. (Nov./Dec. 2009), pp. 2512-2517, vol. 27, No. 6, American Vacuum Society.
Satou, et al., Study of Bi-layer Silylation Process for 193 nm Lithography, Part of SPIE Conference on Advances in Resist Technology and Processing XVI, (Mar. 1999), pp. 251-261, vol. 3678, SPIE, Santa Clara, California, USA.
Somervell, et al., Study of the Fundamental Contributions to Line Edge Roughness in a 193 nm, Top Surface Imaging Systems, J. Vac. Sci. Technol. (Sep./Oct. 2000), pp. 2551-2559, vol. B 18, No. 5, American Vacuum Society.
Tanishiro, et al., UHV Transmission Electron Microscopy on the Reconstructed Surface of (111) Gold, Surface Science 111 (Nov. 2, 1981) pp. 395-413, North-Holland Publishing Company.
Thackeray, et al., Approaches to Deep Ultraviolet Photolithography Utilizing Acid Hardened Resin Photoresist Systems, J. Vac. Sci. Technol. (Nov./Dec. 1989), pp. 1620-1623, vol. 7, No. 6, American Vacuum Society.
Tseng, et al., Enhanced Block Copolymer Lithography Using Sequential Infiltration Synthesis, The Journal of Physical Chemistry (Jul. 2011), pp. 17725-17729, vol. 115, American Chemical Society.
Tseng, et al., Enhanced Lithographic Imaging Layer Meets Semiconductor Manufacturing Specification a Decade Early, Advanced Materials (May 2012), pp. 2608-2613, vol. 24.
Tseng, et al., Enhanced Polymeric Lithography Resists via Sequential Infiltration Synthesis, Journal of Materials Chemistry, (Aug. 2011), pp. 11722-11725, vol. 21.
Tseng, et al., Etch Properties of Resists Modified by Sequential Infiltration System, J. Vac. Sci. Technol. (Dec. 2011), pp. 06FG01-1-06FG01-4, vol. B 29(6), American Vacuum Society.
Tuda, Profile Evolution During Polysilicon Gate Etching With Low-Pressure High-Density C12/HBr/O2 Plasma Chemistries, J. Vac. Sci. Technol. (May/Jun. 2001), pp. 711-717, vol. A 19(3), American Vacuum Society.
US Office Action for U.S. Appl. No. 13/902,169, mailed Sep. 18, 2015, 16 pages.
Vertommen, et al., Integrated Silylation and Dry Development of Resist for sub-0.15μm Top Surface Imaging Applications, Journal of Photopolymer Science and Technology, (Spring 1998), pp. 597-612, vol. 11, No. 4.
Wang, et al.,Nanoscopic Morphologies in Block Copolymer Nanorods as Templates for Atomic-Layer Deposition of Semiconductors, Advanced Materials, (Jul. 20, 2009), 21, 2763-2766, 4 pages.
Xiong, et al., Study of Gate Line Edge Roughness Effects in 50 nm Bulk MOSFET Devices, Metrology, Inspection and Process Control for Microlithography XVI, (Jul. 1, 2002), pp. 733-741, vol. 4689, SPIE.
Ye et al., Statistical Modeling and Simulation of Threshold Variation Under Random Dopant Fluctuations and Line-Edge Roughness, IEEE Transactions on Very Large Scale Integration (VLSI) Systems (Jun. 2011), pp. 987-996, vol. 19, No. 6.
Notice of Allowance for U.S. Appl. No. 13/209,190, dated Jun. 17, 2016, 7 pages.

\* cited by examiner

SEQUENTIAL INFILTRATION SYNTHESIS FOR ADVANCED LITHOGRAPHY

CROSS REFERENCE TO RELATED PATENT APPLICATIONS

This application is a divisional of U.S. patent application Ser. No. 13/427,619, filed Mar. 22, 2012, which claims priority to U.S. Provisional Patent Application No. 61/467,166, filed Mar. 24, 2011 incorporated herein by reference in its entirety.

STATEMENT OF GOVERNMENT INTEREST

The United States Government has rights in this invention pursuant to Contract No. DE-AC02-06CH11357 between the United States Government and the UChicago Argonne, LLC, representing Argonne National Laboratory.

FIELD OF THE INVENTION

This invention relates to improved resist materials for plasma or milling transfer of patterns to a substrate material and methods of preparing such materials. More specifically this invention relates to organic resist materials or partially organic resist materials infiltrated with inorganic protective components that enhance the resistance of the resist materials to pattern transfer processes such as plasma etching and associated methods.

BACKGROUND

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Lithography followed by plasma etching is the standard method for manufacturing microelectronics and many other devices. Requirements on lateral resolution and vertical dimensions translate into significant engineering challenges for the lithographic imaging layer (resist).

Photolithography and electron-beam lithography are the most successful and commonly used lithography techniques for preparing high-resolution patterns. The success of these methods is highly dependent on the processing of the resist layer. A resist material needs to satisfy requirements on resolution, exposure sensitivity, contrast, line-edge roughness, depth-of-focus, and etch resistance. To satisfy the requirements of both resolution and line-edge roughness, the resist layer must be thin. For photolithography, high resolution is achieved by reducing the wavelength of the light source and increasing the numerical aperture. The trade-off for improving resolution using this method is the reduction in the depth-of-focus. This imposes a fundamental upper limit on the resist thickness. In the case of electron-beam lithography, forward scattering of electrons is a fundamental limitation on resolution. Scattering is minimized by using a thin resist layer, in addition to increasing the electron energy. Thus, in both techniques, as a result of different physical limitations, the thickness of the resist layer suitable for high-resolution patterning is limited. Issues associated with pattern collapse also effectively limit the thickness of resist films.

Significantly, the limit on the resist layer thickness runs contrary to the needs of pattern transfer to a substrate by plasma etching or ion milling. Most resist materials erode significantly and fairly quickly relative to the substrate during plasma etching or milling. If the resist layer is too thin, then the pattern cannot be etched deeply into the substrate using solely the resist layer as the etch mask. Accordingly, the thinness of lithography resists presently limits the fabrication of high aspect-ratio structures. To overcome this problem, the resist pattern is usually transferred to a hard mask layer that provides greater etch resistance. However, this complicates the fabrication process and leads to additional image blur, feature bias, and line edge roughness. Disadvantages associated with introducing hard masks have motivated recent work to improve the etch resistance of high resolution e-beam resists, such as poly (methyl methacrylate) (PMMA) and ZEP520A, by processing following resist exposure and development.

Accordingly, there is a need for resist materials that are resistant to etching process conditions. Greater etch resistance allows for adequate etching time necessary to create features, including high-aspect ratio features, in substrate materials such as silicon. Additionally, the resist material overlaying the substrate during plasma etching or milling should be thin so that fine pattern features can be sharply resolved in the substrate. Thus, the resist needs to have high resolution, little line-edge roughness, high resistance to plasma etching, and significant mechanical stiffness to prevent pattern collapse during wet development. Presently, no resist material satisfies all these requirements simultaneously. Such improved mask materials would be applicable to a range of microelectronic and MEMS manufacturing applications among others.

There have been attempts to improve resist etch resistance by infusing the resist film or mask with inorganic materials, most notably silicon. However, these processes suffer from problems related to line-edge roughness, excessive swelling and low contrast. Few of these methods have been demonstrated for nanoscale patterns (<100 nm). Some recent work of this area concerned photoresist materials that are not currently used in industrial production. As a result, there is a need to develop improved methods to prepare resist masks with improved etch resistance.

SUMMARY

The present invention includes modified organic materials or partially organic materials that have an improved resistance to plasma etching or milling and processes for preparing such materials. The materials may be utilized as a resist mask layer to transfer various predetermined patterns via plasma etching or milling into a substrate layer such as a silicon substrate. Resist materials used in lithographic processes are generally carbon-based polymers and therefore exhibit low inherent etch resistance. To effectively transfer patterns to functional materials, a hard mask is often required. Implementing a hard mask requires additional processing steps that add to the cost of the overall process and can result in diminished pattern fidelity after pattern transfer such as by plasma etching. However, according to the present invention, etch resistance of various organic materials is improved by modifying the organic material with an inorganic protective component through sequential infiltration synthesis (SIS). The SIS process utilizes alternating exposures to gas phase precursors that infiltrate the organic or partially organic resist material to form the protective component within the resist layer. The protective component may include various metal, metal oxide, and other inorganic materials selected to improve the etch resistance of the organic resist layer.

The resulting materials allow for transfer of high fidelity features into the substrate while obviating the need for an intermediate hard mask. The SIS process can render a polymeric material suitable for direct use as a hard mask, thereby eliminating multiple steps from conventional lithographic processing. The improvement in pattern quality using the present materials and processes can also lead to significantly better product yield. Because the thermal budget of the SIS process is low and does not involve exposure to plasma discharge, it is a more benign process than other methods for depositing a hard mask such as plasma enhanced chemical vapor deposition (PECVD), low pressure chemical vapor deposition (LPCVD), sputtering or thermal oxidation. SIS also eliminates problems related to the stress and adhesion of conventional hard mask films. Moreover, it enables the use of thinner resist films, thereby preventing pattern collapse In one an embodiment, a method of preparing an organic resist mask by sequential infiltration synthesis (SIS) for use in forming at least one patterned feature in a substrate material by a plasma etching process, comprises providing a substrate having an organic resist mask layer located over a surface of the substrate. The organic resist is characterized by an etch resistance and including at least one patterned feature adapted to be transferred to the substrate material by the plasma etching process. The method further comprises modifying the etch resistance of the organic resist mask layer by exposing the organic resist to a plurality of SIS cycles comprising alternating exposures of a first precursor reactive with the organic resist and a second precursor reactive with the moieties created by the first precursor within the organic resist to form an inorganic protective etch component within the bulk organic resist mask layer, thereby increasing the etch resistance of the organic resist mask layer in response to the plasma etching process.

In another embodiment, a modified organic resist mask layer having an increased resistance to plasma etching in response to transferring at least one high-resolution patterned feature to a substrate material by plasma etching, comprises an organic resist material disposed over the substrate material and includes at least one patterned feature. An inorganic protective etch component is disposed over at least a portion of the surface of the organic resist material and within at least a portion of the organic resist material to a predetermined infiltration depth within the organic resist material. The plasma etch resistance of the organic resist mask layer is selectively controllable by establishing the infiltration depth of the inorganic protective etch component and/or the number of SIS cycles.

In yet another embodiment, a method of plasma etching a patterned feature in a substrate material without a hard mask using an organic or partially organic resist mask layer modified by sequential infiltration synthesis (SIS), comprises providing a substrate material and applying the resist mask layer over a surface of the substrate material. The resist mask layer has a layer thickness and comprises a first organic or partially organic material. The method further includes forming the patterned feature in the resist mask layer by lithography and modifying the plasma etch resistance of the resist mask layer by performing a plurality of SIS cycles. Each SIS cycle comprises exposing the resist mask layer to a first precursor reactive with the first organic or partially organic material and exposing the resist mask layer to a second precursor to form a protective etch component within at least a portion of the first resist material. A plasma etching process then etches the patterned feature in the substrate material to a feature depth. The modified organic or partially organic resist mask layer is characterized by a modified plasma etch resistance greater than the initial plasma etch resistance.

In various embodiments, the resist layer comprises two or more different organic or organometallic materials, such as a block copolymer, treated with SIS such that the inorganic precursors selectively interact with one or more of the organic materials. Those regions of the resist layer that have interacted with the inorganic precursors are then used as the mask for a pattern transfer to an underlying substrate material.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 1A shows need for hard masks due to low plasma etch resistance of resists. FIG. 1B shows pattern collapse of high aspect-ratio resist structures due to capillary forces during post-development drying. FIG. 1C shows a summary of constraints on aspect-ratio of resist structures.

FIG. 10A is a plot of line-edge roughness (peak-to-trough)

obtained from the AFM measurements depicted of FIGS. 9A and 9B and FIG. 10B is a plot of line-edge roughness (1-sigma) obtained from AFM measurements for a ZEP resist layer before and after the SIS process.

FIG. 15A is energy dispersive X-ray (EDX) line scan of a cross section of SIS-modified photoresist on a bottom antireflection coating (BARC) on silicon. The dark line in FIG. 15A is the Al K-line signal along the arrow. The trenches etched using SIS-modified photoresist as mask without use of an additional hard mask are shown in FIG. 15B.

FIG. 16A shows change in line width vs. SIS cycles; FIG. 16B shows the percent change in PMMA volume vs. SIS cycles. FIG. 16C shows line-edge roughness (LER) (1-sigma) prior to plasma etching of lithographically defined lines in the SIS-modified resist layer, as a function of SIS cycles.

In FIG. 17A, the top dashed line shows the ideal case where plasma etching has no effect on line width. The lower dotted line shows the best linear fit to data points, revealing a ~5 nm reduction in line width after plasma etching under these conditions. FIG. 17B shows a comparison of LER before and after plasma etching. LER is found to be unchanged within the error in metrology.

FIG. 18A show an array of test patterns from 30 nm wide lies to 110 nm-wide lines. FIG. 18B shows the details of the test pattern inside the box corresponding to FIG. 18A. The dark lines remain after development while the white areas are removed.

FIG. 19A shows the secondary-electron SEM image of the lines and FIG. 19B is a grey-scale average across the y-direction of the box as a function of position x in the same sample. The line width is taken as the distance w as shown in FIG. 19B.

FIG. 20A is a secondary-electron image of five (5) lines. FIG. 20B is a binary outline of the lines in the same sample. FIG. 20C is the grey-scale average across the y-direction as a function of position x (black line and symbols), along with a fit to the grey-scale average data using a Gaussian function with a standard deviation of 1.81 nm.

FIG. 21A is a SEM image of the high aspect ration AFM tip used for measurements. FIG. 21B is an image for the image analysis software for measuring line width. FIG. 21C is in image from the image analysis software for determining line edge roughness (LER).

DETAILED DESCRIPTION OF EMBODIMENTS

The present invention describes materials and methods that permit enhanced etching of a substrate material through a pattern transfer process such as plasma etching. The present materials and methods permit substrate etching of features, including deeply etched features, with high resolution and high line-edge quality. In various embodiments, the present materials and methods facilitate etching of high-aspect ratio features in a substrate material with a resist material having a reduced layer thickness relative to conventional resist material layers. The present invention can be utilized in conjunction with various resist materials, substrates, and substrate etching processes, including conventional materials and processes. However, relative to conventional materials and processes, the present invention can reduce overall fabrication complexity and expense while improving performance, particularly with respect to preparation of high-aspect ratio structures. For example, the present materials and methods can eliminate the need for an intermediate hard mask layer.

Figure 1A:
FIG. 1A-1C are schematics showing several problems associated with traditional lithography and etching that SIS may address.

The success of lithography and etching methods depend on the ability of the imaging or resist layer to capture fine features with high fidelity. In addition, the imaging or resist layer needs to play the role of etch mask. It needs to be resistant to plasma etching to allow pattern transfer into the underlying material. The imaging layer, however, is usually carbon-based and has little resistance to plasma etching. Previously, this non-ideality is circumvented by first transferring patterns to an intermediate layer (hard mask) that has greater etch resistance before being etched into the desired material (See FIG. 1A). The hard mask material needs to be chosen carefully to satisfy requirements on etch selectivities relative to both resist and substrate. In addition, the hard mask deposition process may be subject to severe thermal budget limitations. It must not produce contaminants during plasma etching and must be easily removable after the etching process. Such a material can be difficult to find, and its use can add significant complexities to the overall manufacturing process. Even if a suitable hard mask material is found, the imaging layer needs to have a minimum amount of etch resistance to allow pattern transfer into the hard mask itself.

Figure 1B:
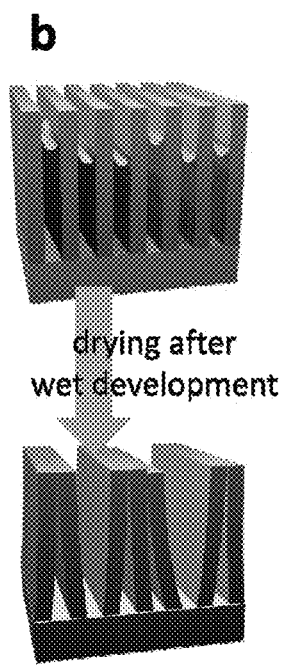
Figure 1C:
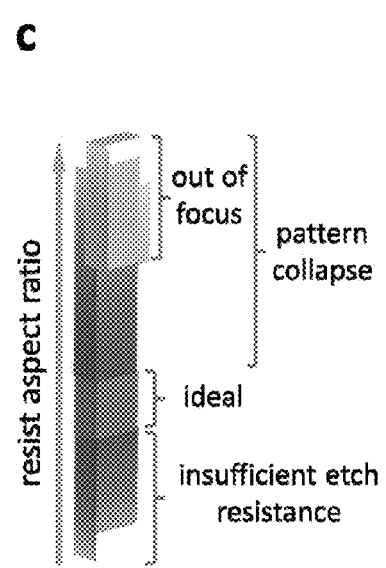

Although one could simply use a thicker resist layer to achieve the desired etch resistance, the requirements on lateral resolution impose an upper limit to the usable thickness. In order to achieve high lateral resolution, the imaging layer needs to be thin to ensure a focused image of the pattern throughout the thickness of the layer. Indeed, with each advance in photolithographic technology, the depth-of-focus is reduced, requiring ever thinner imaging layers. The imaging layer's thickness is further constrained by the need to prevent pattern collapse during the development and drying process. Surface tension of the wet developer and rinse chemicals can exert sufficient force to mechanically distort the printed patterns (FIG. 1B), especially when the aspect-ratio is large. In industrial 193 nm photolithography, the aspect-ratio of photoresist features is limited to less than 3 to prevent pattern collapse. However, a thin resist film is unsuitable for plasma etching. These conflicting requirements, summarized in FIG. 1C, present serious challenges for the high-volume manufacturing of any complex system that needs fine patterns, including microelectronic circuitry. Although hard masks provide a solution, their use adds to the cost and complexity of the manufacturing process. For these reasons, an imaging layer that combines high lateral resolution and high resistance to plasma etching is desirable.

The present methods employ a resist material modification strategy to enhance the resistance of the resist material layer to unintended etching during the substrate etching process. By enhancing etching resistance of the resist layer, a thinner modified resist material layer may be applied to the substrate to efficiently achieve high quality features (e.g., feature resolution and feature line quality) relative to an unmodified resist layer or an unmodified resist layer in combination with a hard mask. Likewise, because of improved etch resistance, deeper features may be etched into the substrate with a modified resist material layer relative to an unmodified resist layer of the same thickness. The modified resist material layer exhibits a longer survival period during etching relative to the unmodified resist layer, permitting longer etching and/or formation of finer features by virtue of using relatively thinner resist layers.

Modified resist materials with enhanced etch resistance (relative to the etch resistance of the unmodified resist material) are prepared by sequential infiltration synthesis (SIS). SIS is described in detail in U.S. Provisional Application No. 61/374,349, filed on Aug. 17, 2010, and U.S. application Ser. No. 13/209,190, filed on Aug. 12, 2011 which are incorporated herein in their entirety. This resist material modification strategy is flexible and may be utilized with conventional resist materials (e.g., photoresists, deep-ultraviolet (DUV) resists, extreme-ultraviolet (EUV) resist materials), e-beam resists materials (e.g., PMMA, ZEP520), as well as block copolymer resist. Virtually any polymer resist material can benefit from SIS-modification, including PMMA=and novolac-based photoresists, which are commonly used in photolithography. EUV resists, of which PMMA is an exploratory candidate, may also benefit from the SIS process to improve etch resistance. Additionally, circumventing the need for an intermediate hard mask can facilitate nanostructure fabrication on a wide variety of substrate materials that may be used in a lithographic process such as silicon, silicon nitride, carbon-based substrate materials (e.g., graphene and diamond) that have no etch selectivity relative to organic resist materials, metals, and metal oxides.

Moreover, using self-assembled polymeric materials such as block copolymers combined with SIS treatment, in which the SIS precursors interact selectively with a portion of the block(s) within the copolymer, patterned materials can be fabricated using bottom-up approaches without requiring introduction of a separate hard mask layer. As described in detail below, the arrangement of block copolymer materials permits the SIS modifying reactions to take place selectively in only one or more of the polymer blocks within the resist material to create highly etch resistant masks for large-area, low-cost nanopatterning.

In general, the SIS process involves exposing the patterned organic or partially organic resist material layer to various gas phase precursors to synthesize protective components in situ. SIS coats the surface of the resist material but also infiltrates into the bulk resist material as well. The gas phase precursors are selected for reaction with the resist material. A wide range of precursors are available for selection for SIS modification which are capable of forming inorganic protective components within a variety of organic resist materials. Examples of inorganic protective components prepared by SIS include $Al_2O_3$, $TiO_2$, ZnO, $SiO_2$, $HfO_2$, $ZrO_2$ and W. However, other metal oxides, metals, and other inorganic materials may also be prepared using SIS. For example, various known precursors utilized with atomic layer deposition (ALD) in preparation of layers of metal, metal oxide, metal nitride, metal silicide, and metal halide, ternary, and various multi-component metal-containing systems.

In various embodiments of the present methods, the SIS process uses a pair of precursors to form the inorganic protective component where one precursor comprises a metal or metal-containing compound selected to infiltrate into and react with the resist material. The second precursor comprises a compound selected to react with the first precursor (or a portion thereof) bound to the surface and within the bulk of the resist material. The protective component is accordingly synthesized on the surface and within the bulk of the resist material by reaction of the first precursor and the second precursor. Although a wide range of precursors are suitable for SIS-modification, examples of various precursors include, but are not limited to: trimethyl aluminum (TMA), titanium tetrachloride ($TiCl_4$), diethyl zinc (DEZ), and tungsten hexafluoride ($WF_6$). The scope of available precursors and protective components for particular resist materials may be further broadened by performing an initial SIS seed layer to form a metal or metal oxide layer reactive with other precursors. For example, an $Al_2O_3$ seed layer may be utilized to seed the growth of other inorganic materials which do not have direct selective chemistry with pure PS-b-PMMA polymer, e.g., ZnO, MgO, $SiO_2$, etc.

The second precursor is selected in view of the first precursor to carry out the SIS reaction within the resist material to form the protective component. In various embodiments the second precursor may be an oxygen source (e.g., $H_2O$, $O_2$, $O_3$, $H_2O_2$), a reducing agent ($H_2$, $H_2S_2Si_2H_6$, etc.), or other compound reactive with the first precursor. One of skill in the art will appreciate that the order of the precursors may be altered in various embodiments and that the nomenclature 'first precursor' and 'second precursor' is used herein for ease of reference. For instance, in some embodiments the second precursor (e.g., $H_2O$, $H_2S$) can be selected to react with or bind to a specific functional group in the resist material and utilized first in the SIS sequence, and the metal-containing precursor can be utilized next in the SIS sequence so as to react with the adsorbed or bound second precursor. One of skill in the art will further appreciate that various systems may comprise more than two precursors. The wide variety of resist material/SIS precursor combinations make the process applicable to a virtually limitless number of resist materials to which a broad range of protective components may be formed by SIS.

By way of example, SIS of a conventional PMMA resist material deposited on a substrate, e.g., silicon, may be achieved by reacting the PMMA layer with various gas-phase precursors for synthesis of an inorganic protective component. PMMA is a common high-resolution electron beam resist material. However, it is well known that PMMA has relatively poor resistance to plasma etching. SIS may be used to modify the PMMA resist layer to improve the resistance of the PMMA to plasma etching. In various embodiments, the inorganic protective compound may be, for example, $Al_2O_3$. However, other inorganic protective components may be prepared by SIS modification of PMMA as well as SIS modification of other resist materials, including ZEP520A, poly(methyl glutarimide) (PMGI), phenol formaldehyde resin (DNQ/Novolac), polyhydroxystyrene-based polymers, polyimides, SU-8, photoresist, and others. In some embodiments, the organic resist mask layer comprises a partially organic resist where the organic component is less than 100% of the resist mask layer. The SIS process produces a modified PMMA material layer that is able to withstand a longer plasma etching cycle, yet the modified resist material layer can be readily removed from the substrate.

Figure 2:
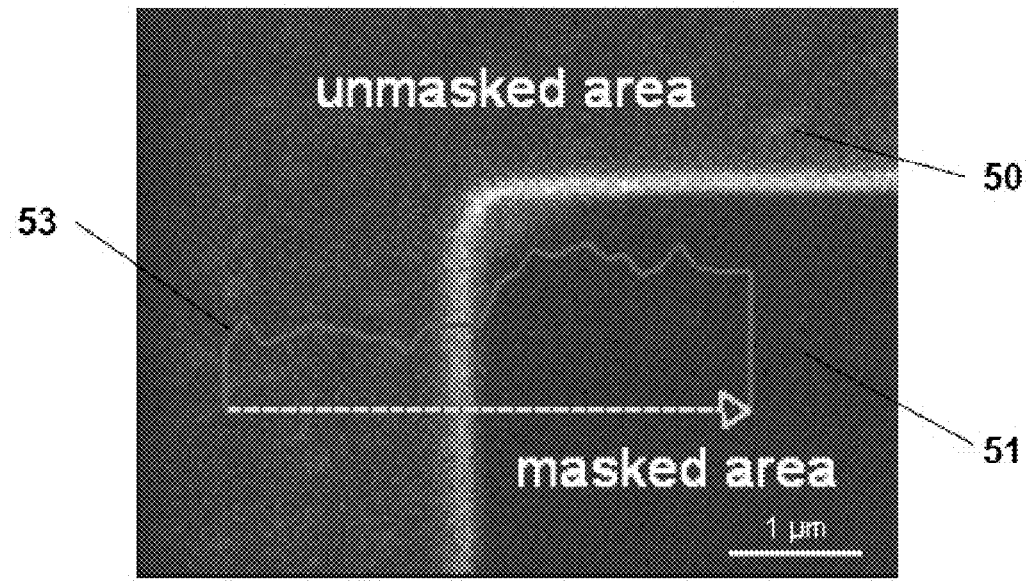
FIG. 2 shows a scanning electron micrograph and correlative energy dispersive X-ray (EDX) data of a SIS modified PMMA resist material layer according to an embodiment of the present invention after a two-minute silicon main etching step, the overlay curve plots the aluminum (Al) signal as a function of position.
Figure 3:
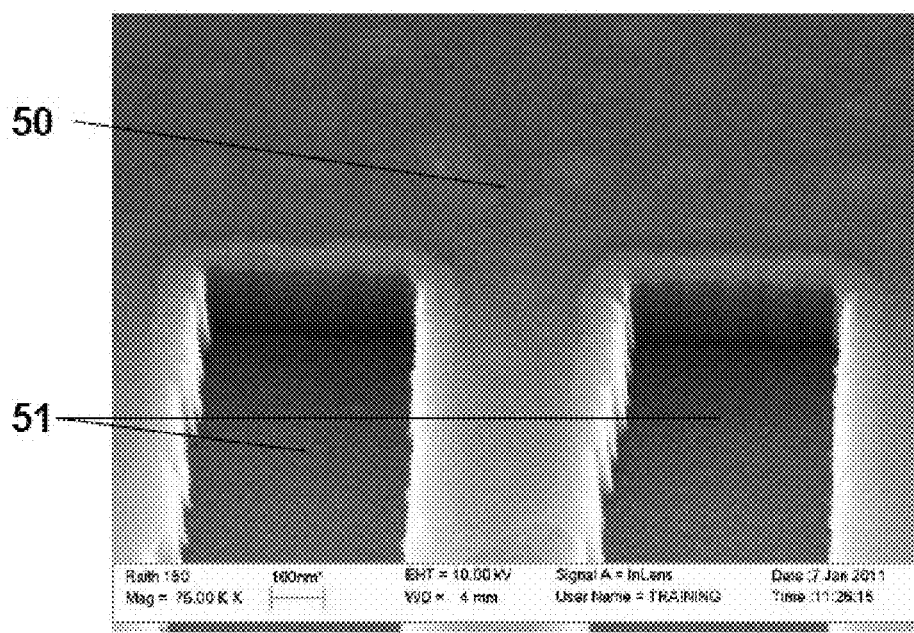
FIG. 3 is a backscattered scanning electron microscope (SEM) image of the resist material of FIG. 2 over a silicon substrate after two minutes of silicon main etch.
Figure 4A:
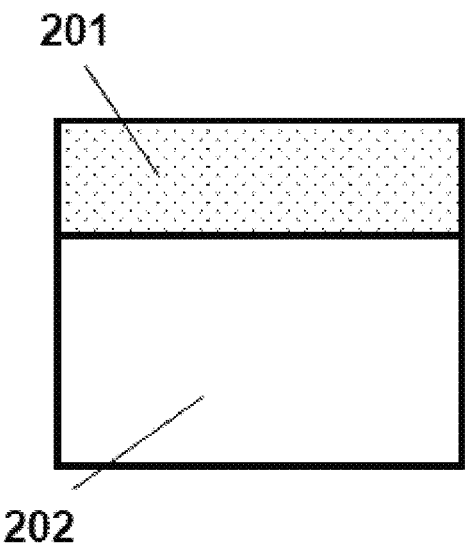
FIGS. 4A-4D are a schematic representation of an embodiment of a process according to the present invention, an organic resist layer 201 overlays a substrate layer 202 (FIG. 4A), a predetermined pattern 203 is prepared in the organic resist layer 201 (FIG. 4B), the patterned resist layer is SIS-modified 201m (FIG. 4C), and an etching process is performed to transfer the pattern 204 to the substrate layer 202 (FIG. 4D).
Figure 4B:
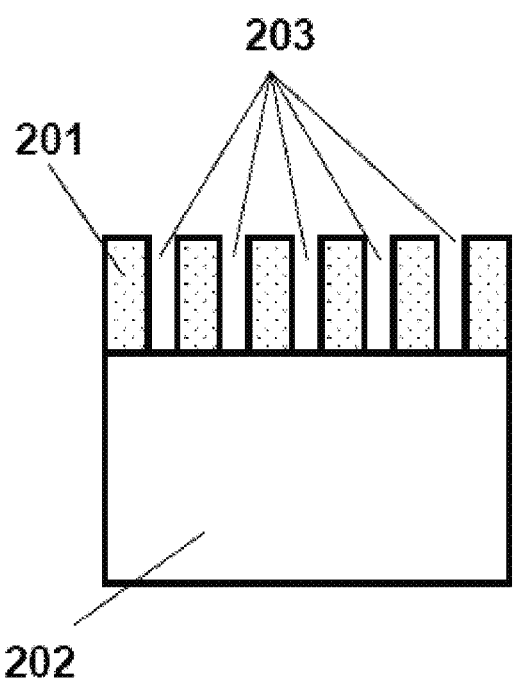
Figure 4C:
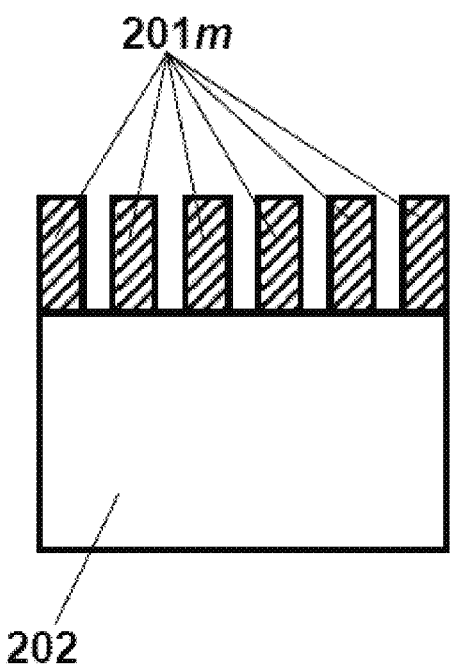
Figure 4D:
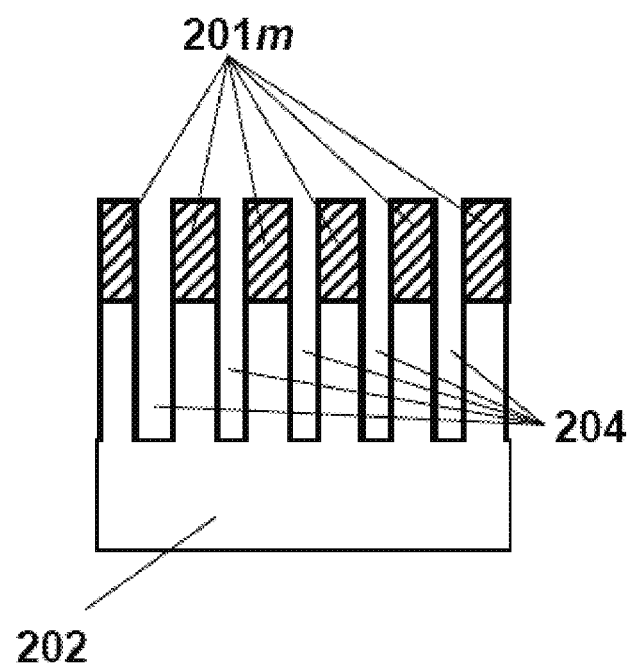
Figure 5:
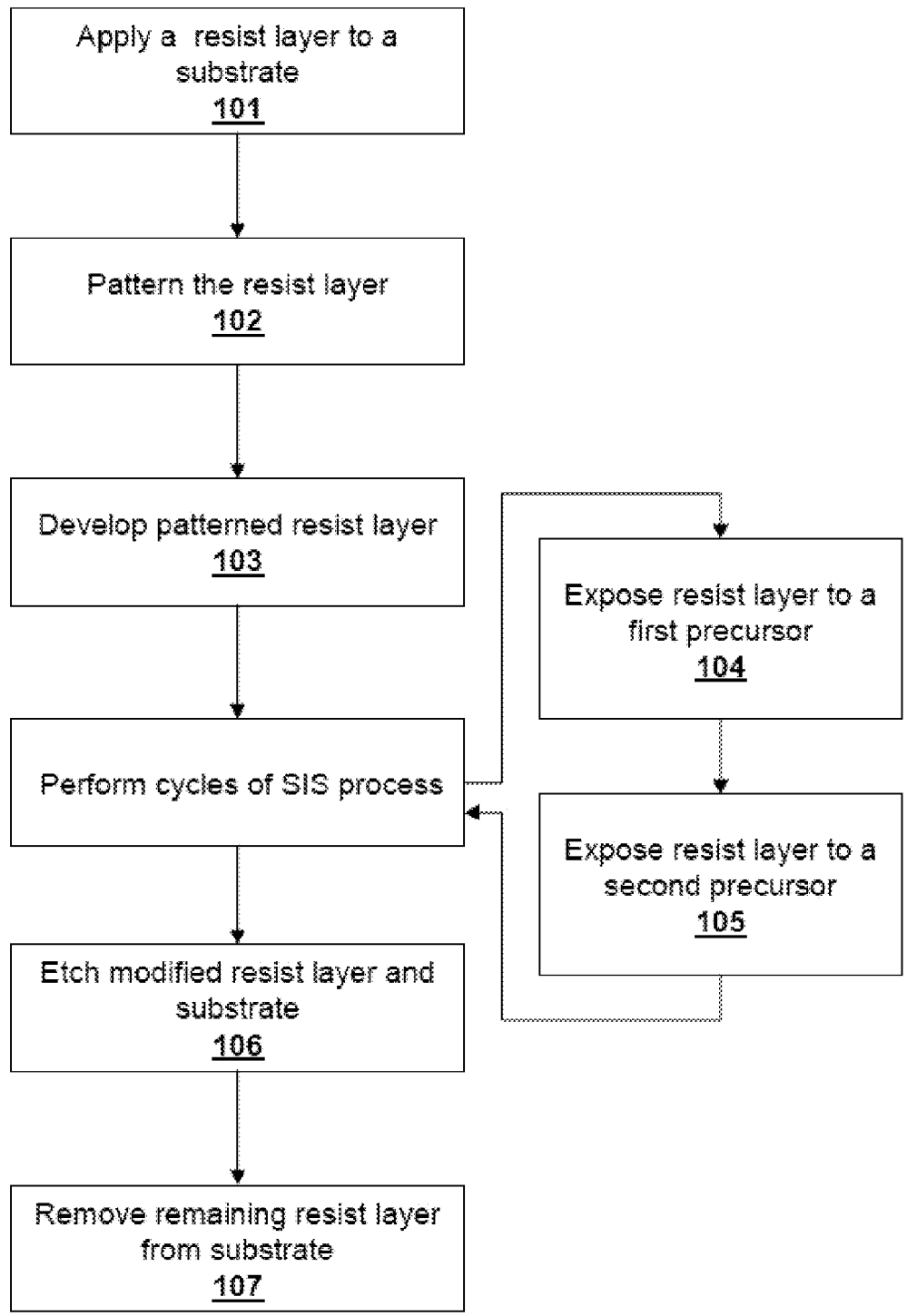
FIG. 5 depicts an embodiment of the process according to the present invention.

The SIS process results in the protective component infiltrating into the bulk of the resist material layer, not merely coating exposed surfaces of the resist layer. By varying the pressure, temperature, and reaction timing of the SIS process precursors, the depth of penetration of the protective component into the resist layer is controllable. The depth of penetration of the protective component can also be controlled by selecting SIS process precursors with specific diffusivities in the resist material layer. FIG. 2 is energy dispersive X-ray (EDX) imaging of a PMMA resist material modified by $Al_2O_3$. The resist material includes an unmasked area 50 and a masked area 51. The presence of aluminum after 16 seconds of an $Al_2O_3$ breakthrough etching step and two minutes of $HBr/O_2$ silicon etching is represented by the overlay curve 53. Although a portion of the resist layer opposite the substrate has been removed by etching, resulting in a thinning of the resist layer, significant aluminum is still present within the PMMA at this depth. The remaining resist layer is seen in a backscattered SEM image in FIG. 3, illustrating that the reaction between resist layer and the precursors has occurred within—rather than simply on top of—the PMMA layer.

The SIS approach may be utilized with a patterned PMMA resist layer. With reference to FIGS. 4A-4D and FIG. 5, the PMMA resist layer 201 is applied (step 101) to a substrate 202 such as a silicon substrate. In various embodiments, spin coating may be used to apply the resist layer 201 to the substrate 202; however, other techniques may also be used. Next, a pattern 203 (shown in FIG. 3B) may be applied to the resist layer (step 102). Patterning of the resist layer 201 may be accomplished by a variety of processes known in the art including electron beam exposure, photolithography and polymer self-assembly processes such as block copolymer. In various embodiments, selected areas of the PMMA resist layer are exposed to an electron beam or photons to form the pattern 203. The resist layer 201 is then developed (step 103) using chemical developers such as methyl isobutyl ketone and isopropyl alcohol (MIBK: IPA). It is understood that lithography techniques such as electron beam lithography and photolithography may be used to form the patterned feature of the organic resist. In addition, selection of block copolymers may be used to prepare the patterned feature of the organic resist. In the case of block copolymers, a self-assembled pattern of spheres, cylinders, lamellae, or other nanoscale morphology comprised of two or more polymer blocks such as polystyrene and poly (methyl methacrylate) constitutes the patterned resist layer.

The patterned resist layer 201 is then modified through the SIS process which comprises a plurality of alternating exposures of the patterned resist layer to a metal precursor compound, e.g., trimethyl aluminum (TMA) (step 104) which may be the first precursor, and a reactant precursor, e.g., $H_2O$ (step 105) which may be the second precursor. Each precursor exposure results in a self-limited half-reaction with the resist layer. A purge step (e.g., $N_2$) may be performed following each precursor exposure to remove residual reactant. Exposures of each reactant can be performed in one step or in a series of two or more steps to control the amount of material that infiltrates the resist. In this example, the exposures were carried out at a temperature of about 85° C. and a pressure of about 5 Torr. Five SIS cycles were performed with a 60-second TMA exposure and a 300-second $H_2O$ exposure in each cycle. PMMA domains are first modified chemically by reaction with TMA, with the Al of the TMA bonding to the PMMA in a highly controllable fashion, owing to the stepwise molecule assembly process. The TMA precursor infiltrates into the bulk of the PMMA. The second precursor, in this case water, completes the reaction with the Al bonded to the surface and within the PMMA bulk, forming the protective $Al_2O_3$ component. The resulting modified resist layer 201m is then etched (step 106) to form the desired features 204 in the substrate. In various embodiments, the features 204 or a portion of the features may be high-aspect ratio features. As used herein, the term high-aspect ratio refers to features having a depth to length and/or width of at least about 1:1. In particular embodiments, high-aspect ratio is between about 1:1 to about 3:1 and may be between about 1:1 and about 100:1 in still further embodiments. The high-aspect ratio features may be formed without an intermediate hard mask. In the case of block copolymer resist, the material is infiltrated with SIS to significantly enhance both the differential etch resistance of the polymer blocks and the overall etch resistance of selected regions of the resist film.

After etching, the remaining SIS-modified resist layer 201m may be removed (step 107) using solvent systems or other techniques known in the art. For example, PMMA SIS-modified with $Al_2O_3$ (PMMA/$Al_2O_3$) can be stripped in a bath of tetramethylammoniumhydroxide (TMAH), which is known to attack aluminum and is found in many photoresist developers. It is also possible to remove the SIS-modified PMMA using a commercially available wet aluminum etchant, comprising a mixture of, for example, $H_3PO_4$, $CH_3COOH$, $HNO_3$, and $H_2O$.

The etching step (106) may be adapted in various embodiments to facilitate substrate etching. For example, to initiate etching into the silicon substrate having a SIS-modified PMMA/$Al_2O_3$ resist layer, a brief breakthrough etch step is used before commencing etching of the substrate to remove the thin layer of $Al_2O_3$ over the substrate in the exposed and unmasked areas. In some embodiment, the first etching step is configured to break through the protective etch component, which may be a thin inorganic material directly covering exposed regions of the substrate as a result of SIS processing. This protective component layer may form from the reaction on the exposed surface of the silicon substrate or the reaction of residual PMMA with the precursors. The initial breakthrough etch step also removes a small amount of SIS-modified resist layer. The etch parameters for the breakthrough etch step are listed in Table 1 for PMMA/$Al_2O_3$ but may be altered in view of different protective components formed by SIS. Design of the breakthrough step plays a significant role in initiating etching into the silicon substrate. For example, using a breakthrough etch step designed to remove $SiO_2$ (Table 1) will not initiate etching into the silicon substrate where the $Al_2O_3$ comprises the protective component.

TABLE 1

Etch parameters for the Al$_2$O$_3$ breakthrough and Si etching steps. ICP: inductive-coupled plasma

| | HBr (sccm) | Cl$_2$ (sccm) | O$_2$ (sccm) | ICP power (W) |
|---|---|---|---|---|
| Al$_2$O$_3$ Breakthrough | 5 | 20 | 0 | 600 |
| SiO$_2$ Breakthrough | 0 | 20 | 0 | 600 |
| Si Main Etching Step | 25 | 0 | 1 | 250 |

Features prepared in substrate materials by photolithography may be characterized by the minimum feature size and feature depth (feature depth of focus). For various devices prepared by photolithography, there is a desire to minimize feature size formed in the substrate while maximizing feature depth of focus. Minimum feature size and depth of focus are driven by the photolithography process and can be defined by the relationships of Equation 1 and Equation 2, respectively.

$$\text{Minimum\_feature\_size} = \frac{k_1 \lambda}{NA} \quad (1)$$

$$\text{Depth\_Of\_Focus} = \frac{k_2 \lambda}{NA^2} \quad (2)$$

Empirical constants: $k_1$ is about 0.25 and $k_2$ is about 0.4 to about 0.6. $\lambda$ represents the wavelength of the photolithography light source and NA is the numerical aperture which is defined by $\sin(\theta)$ and is about 1 for advanced photolithography tools. Accordingly, current conventional photolithography processes are capable of a minimum feature size of about 50 nm and a depth of focus of about 80 to about 120 nm. To achieve this level of photolithography performance the resist layer must be thin, much less than the depth of focus. Similarly, electron beam lithography also requires a thin resist layer to obtain a small minimum feature size, i.e., improved resolution.

Figure 6:
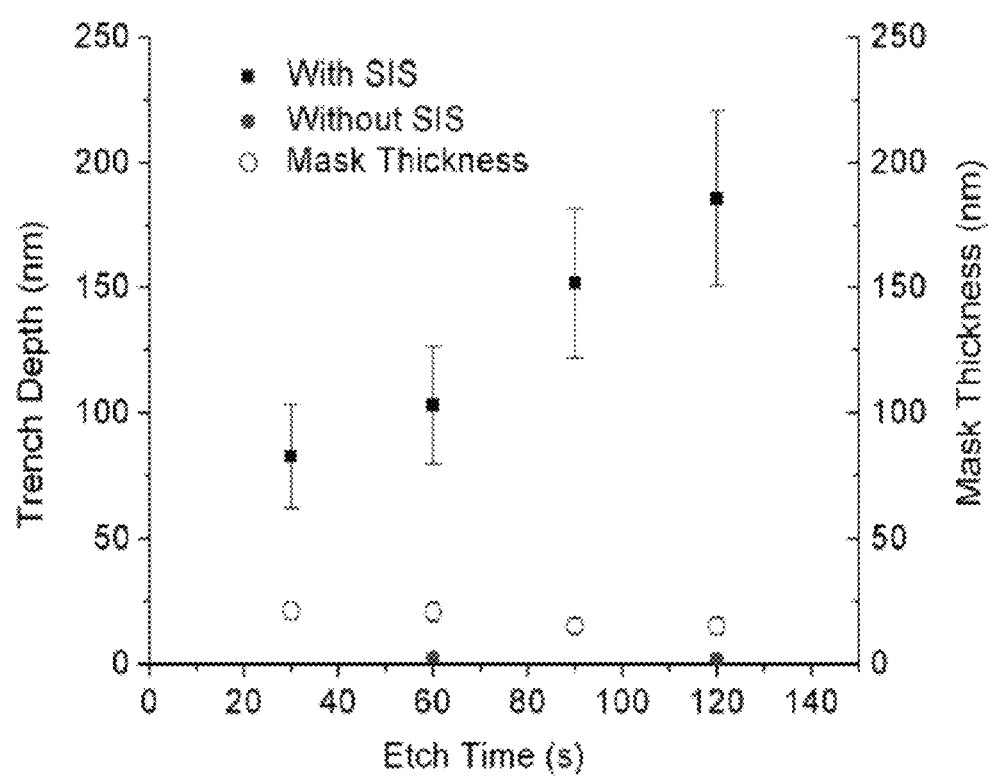
FIG. 6 is a plot of mask thickness and trench depth etched into a Si substrate as a function of the time of the silicon etching step for conventional PMMA resist layers and SIS-modified PMMA having an SIS-$Al_2O_3$ protective component.

SIS-modified resist material layers show significant etch resistance to various etch processes, including a HBr-based Si etch recipe. SIS-modified PMMA can withstand plasma etching during fabrication of deep trenches in the silicon substrate demonstrating an etch rate of one-tenth that of single-crystal silicon. FIG. 6 shows that the improvement in etch resistance enables the fabrication of trenches deeper than 150 nm in silicon, with a starting resist layer of PMMA film only 33 nm thick. Thinner SIS-modified resist layers may also be used, for example, a modified resist layer of about 10 nm could replace a conventional 100 nm resist layer. In comparison, unreacted PMMA alone provides little etch resistance. During the silicon etch step, the mask is etched at ~8 nm/min, about one-tenth of the Si etch rate.

The etch resistance of the SIS-modified resist layer can be modulated by controlling the number of SIS cycles performed. In general, few SIS cycles are needed to significantly increase etch resistance of the resist layer. In various embodiments, from 1 to about 10 SIS cycles are used for extended SIS exposure times, whereas a larger number may be used with shorter SIS exposure times. In particular embodiments, between 2 and 5 SIS cycles are performed. Although the resist layer may be fully infiltrated by the modifying material, modulating the timing, temperature, SIS precursors, and partial pressure of the exposures of the resist material to the SIS precursors controls the depth of infiltration of the SIS treatment. Controlling the SIS infiltration depth permits the resist layer to still be readily removed from the substrate after etching. Thus, by only partially infiltrating the polymer resist material, the deeper portions of the resist proximate the substrate will be preserved as substantially pure polymer film. This will facilitate removal of the resist material (e.g., by dissolving in acetone) after completing the etching process.

Figure 7:
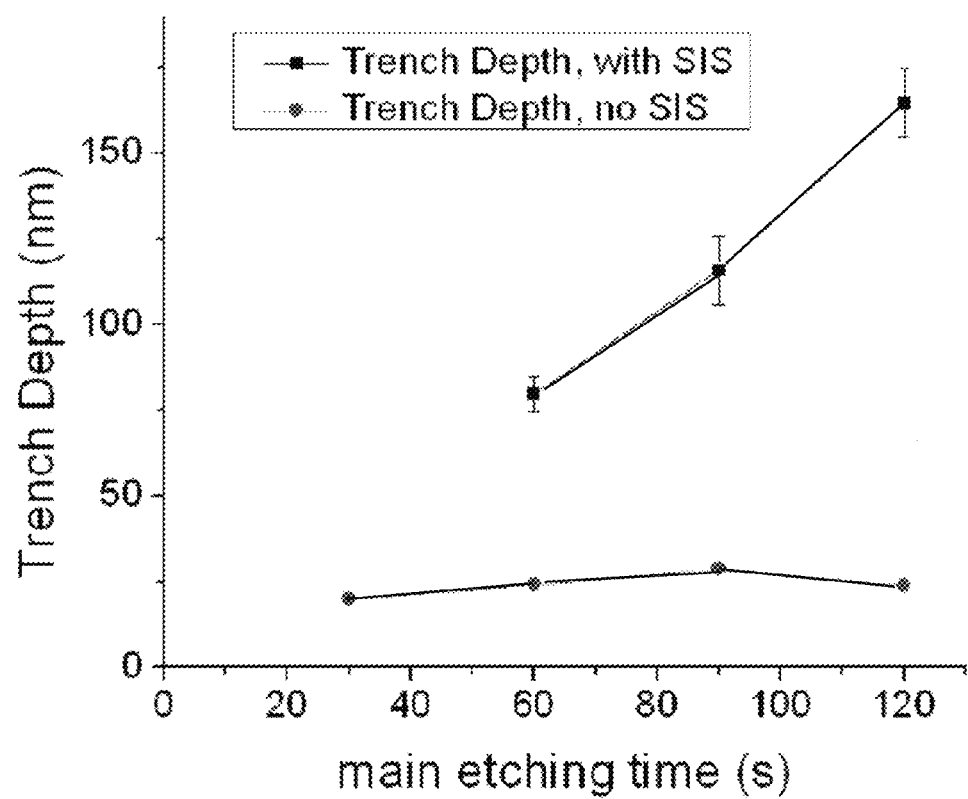
FIG. 7 is a plot of trench depth etched into a Si substrate as a function of the time of the silicon etching step for conventional ZEP520A resist layers and SIS modified ZEP520A with an SIS-$Al_2O_3$ protective component.

FIG. 6 shows a plot of feature depth for a plurality of etched trenches in a silicon substrate fabricated using an e-beam method. Features more than 200 nm deep into the silicon substrate were fabricated after 120 seconds of plasma etching SIS-modified PMMA/Al$_2$O$_3$ resist layer less than 30 nm in thickness. On the other hand, a conventional PMMA resist layer of the same thickness was completely removed from the substrate after 15 seconds of plasma etching without substantial feature transfer to the substrate. SIS-modified PMMA/Al$_2$O$_3$ is estimated to have an etch resistance of about 10:1 compared to silicon (SIS-PMMA:Si). Similarly, FIG. 7 shows a plot of feature depth in a silicon substrate after plasma etching using a SIS-modified ZEP520A/Al$_2$O$_3$ resist layer 50 nm thick. Feature depths achieved with the SIS-modified resist layer are significantly greater than trenches formed using an unmodified ZEP520A resist layer of the same thickness. While feature depth remained substantially constant (about 25 nm) for etch times between 60 and 120 seconds, the trenches were between about 75 and over 150 nm deep over the same time period using SIS-modified ZEP520A.

Figure 8:
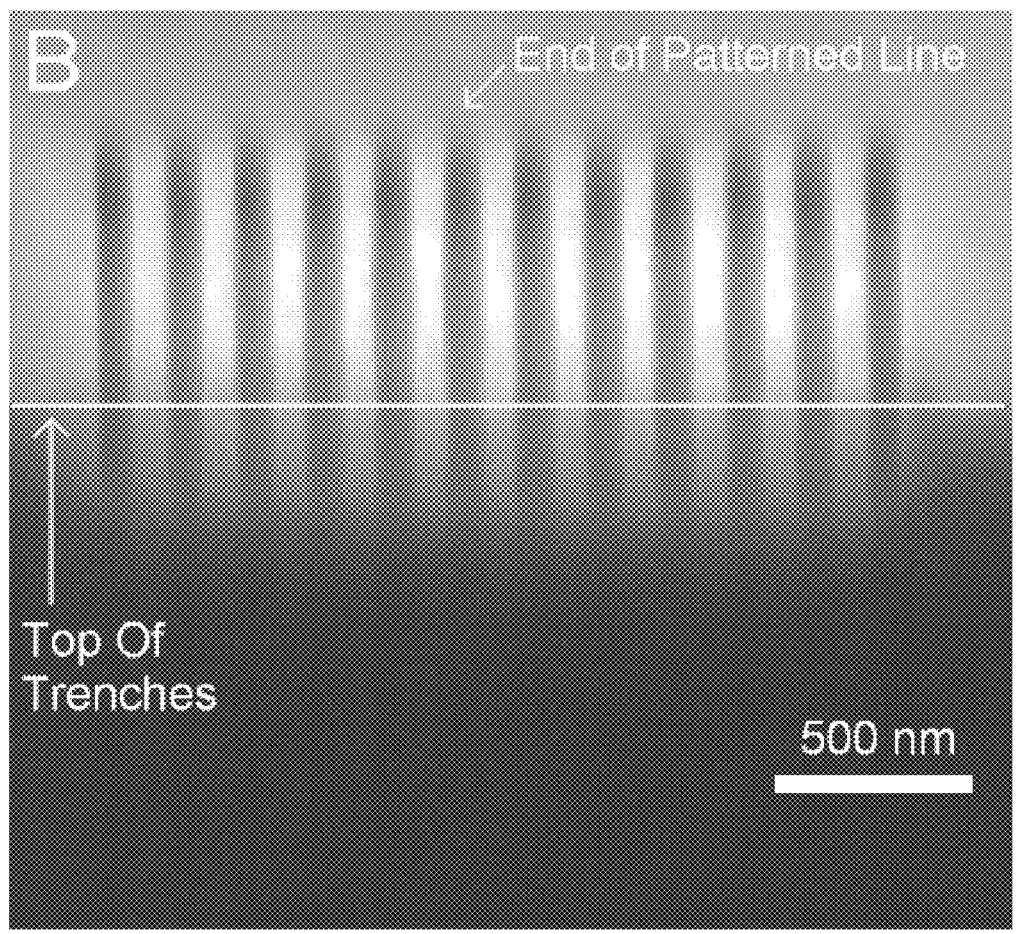
FIG. 8 SEM image of etched trenches (depth ~200 nm, width ~90 nm) in a Si substrate prepared using a 33 nm thick SIS-modified PMMA resist layer without additional hard mask.

Improving the etch resistance of the resist layer by SIS-modification enables fabrication of features, including high-aspect ratio features, in silicon without the need for an intermediate hard mask layer or other procedure that can decrease process efficiency, etch performance and/or etch quality. A range of high-aspect ratio devices and portions of such devices such as DRAM (Dynamic Random Access Memory), interconnect vias, and three-dimensional transistors (e.g., FinFETs) may be made using the SIS-modification process. Potential problems that may arise during hard mask deposition, such as the stress and adhesion of the film, can be avoided as well. The low thermal budget of the SIS process also makes it compatible with most microelectronic fabrication processes. By way of example, FIG. 8 shows a SEM image of a plurality of high-aspect ratio (e.g., greater than 2:1) trenches (200 nm deep by 90 nm wide) formed in a silicon substrate. A 33-nm-thick SIS-modified PMMA/Al$_2$O$_3$ resist layer was used without the aid of an additional hard mask.

Figure 9A:
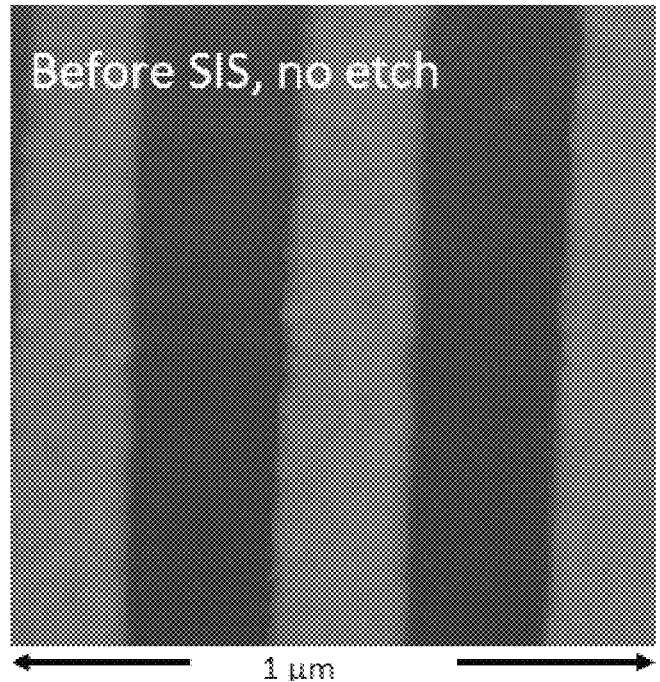
FIGS. 9A and 9B are atomic force microscope (AFM) topographic images of a PMMA layer before (FIG. 9A) and after the SIS process (FIG. 9B) prior to etching.
Figure 9B:
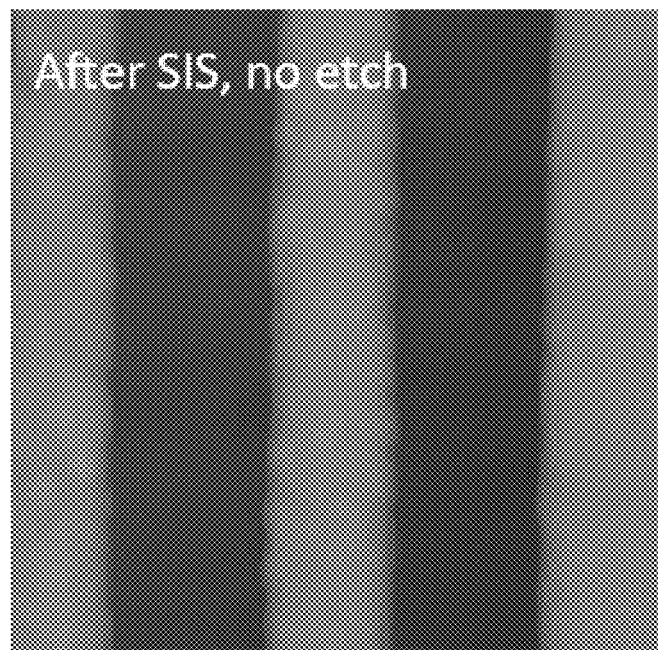
Figure 10A:
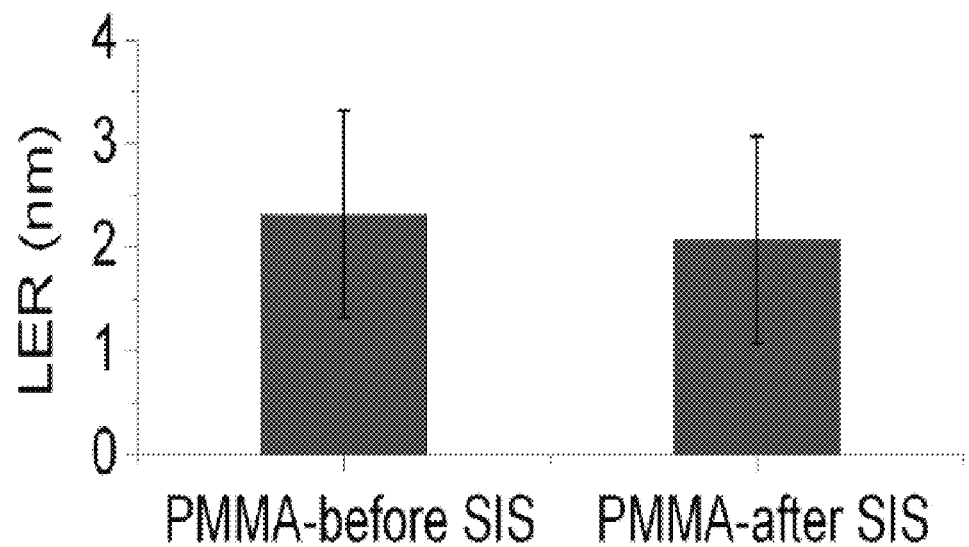
FIGS. 10A-B are plots of line-edge roughness where
Figure 10B:
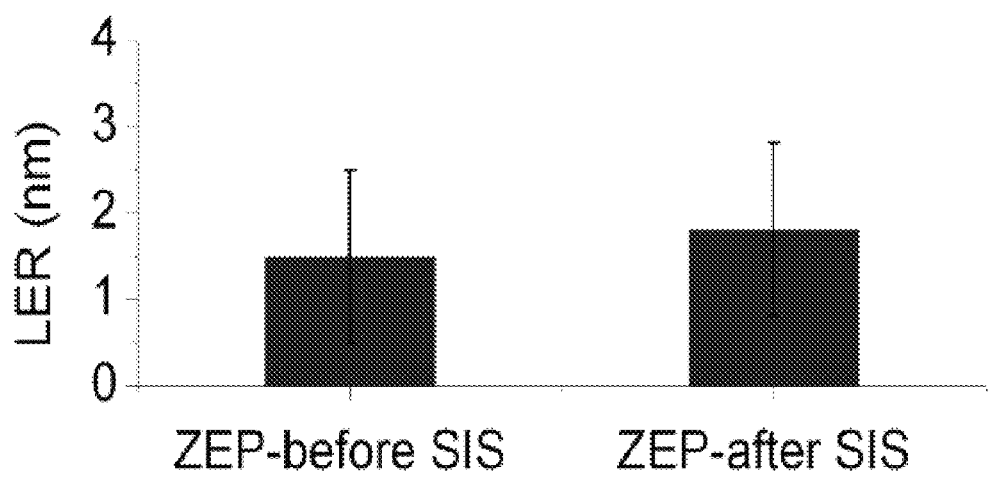

SIS modification of the resist layer does not negatively affect quality of the etched features formed in the substrate. Although conventional etch resistance improvement strategies, e.g., silylated resists, can increase the line-edge roughness (LER) or change the dimensions of the printed pattern, SIS resist layer modification does not suffer from these problems. FIG. 9A shows an atomic force microscope topographic image of a conventional PMMA resist layer and FIG. 9B shows the PMMA resist layer after SIS treatment. FIG. 10A shows that there is little change in the LER when using SIS-modified PMMA/Al$_2$O$_3$. FIG. 10B depicts a similar result for SIS-modified ZEP/Al$_2$O$_3$. Thus, SIS permits realization of both high-resolution properties of PMMA and the etch-resistance properties of Al$_2$O$_3$ and hard masks without degrading the initial printed image in the PMMA resist.

In one embodiment, electron-beam (e-beam) lithography was used to pattern thin PMMA films (thickness: 30-120 nm) on silicon. PMMA was spun on silicon and dried on a hot plate at 180° C. for 90 s. Exposure was performed in a JEOL JBX-9300FS e-beam lithography tool at 100 keV, with doses appropriate for the resist thickness. Following the e-beam exposure, the PMMA resist was developed in MIBK:IPA (methyl isobutyl ketone: isopropanol) (1:3) for 45 s at −5° C., rinsed for 30 s in IPA, and blow-dried using nitrogen.

The patterned PMMA films were treated by the SIS process to enhance plasma etch resistance. In this experiment, the SIS process was adapted for a commercial reactor capable of large scale batch processing (Beneq TFS500). While the temperature (85° C.) and pressure (5 Torr) were identical to the established process, the reaction time of each half-cycle was lengthened to 600 s, to account for consumption of the precursors by the PMMA film.

The SIS-treated PMMA was used directly as etch mask, and patterns were transferred directly into the silicon substrate using HBr-based plasma chemistry. Following plasma etching, the samples were cleaned in an aqueous solution of hydrogen peroxide and ammonium hydroxide (RCA clean), to remove deposits generated during plasma etching and remaining etch mask material.

Figures 13A, 13B, 13C, 13D:
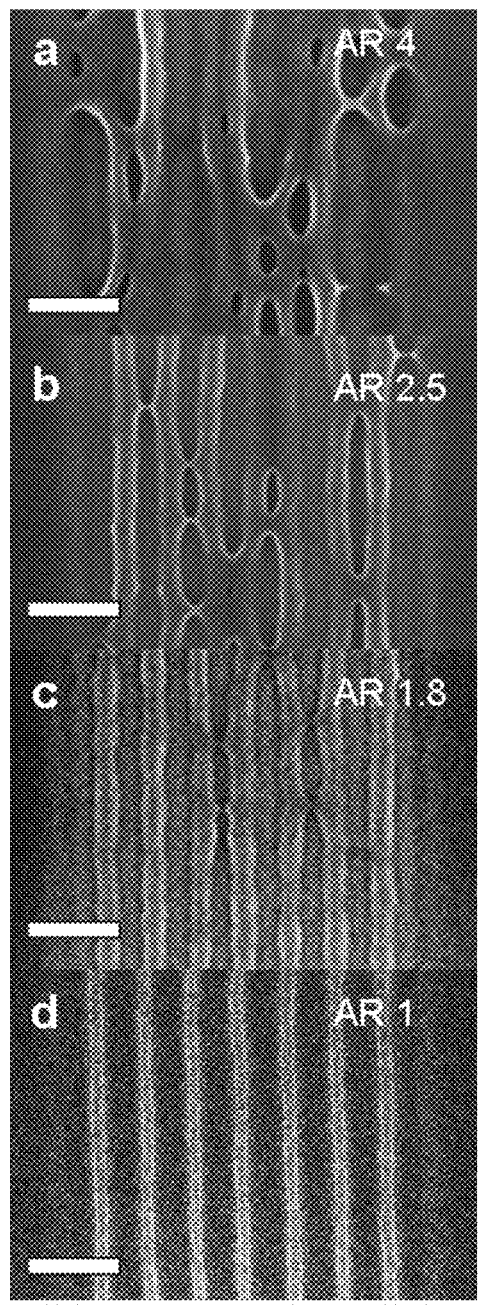
FIGS. 13A-D are SEM images showing how reducing the PMMA thickness can prevent pattern collapse. The test pattern is a series of 30 nm-wide lines in a 60 nm pitch. The resist aspect-ratio (AR) is determined for a 30 nm line. Thickness of PMMA film: 120 nm (FIG. 13A). 75 nm (FIG. 13B). 53 nm (FIG. 13C). 30 nm (FIG. 13D). Scale bar in all images: 100 nm.
Figure 14:
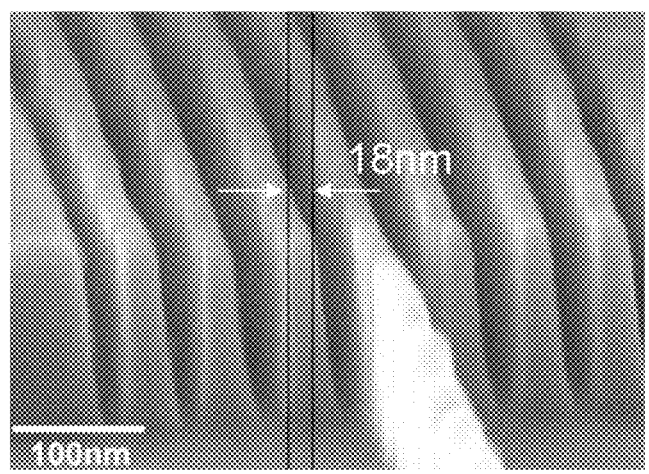
FIG. 14 is an SEM image showing the high aspect-ratio (greater than 6:1), sub-20 nm dense lines etched into silicon using SIS-modified PMMA (5 cycles SIS-$Al_2O_3$), without using an intermediate hard mask.

FIGS. 13A-D show that the reduction of resist aspect-ratio is effective in preventing pattern collapse. Using a resist aspect-ratio of 1 (FIG. 13D), following by SIS enhancement, the structures in FIG. 14 can be fabricated easily: dense lines, narrower than 20 nm, and deeply etched into the silicon substrate were made using SIS-modification of a mere 30 nm-thick PMMA resist film. For comparison, if a $SiO_2$ intermediate hard mask were used, the etch depth of 130 nm shown in FIG. 14 would have required a minimum $SiO_2$ thickness of ~5 nm, using a typical Si:$SiO_2$ selectivity of 25:1 for HBr-based etch chemistry. To fully etch through the $SiO_2$ hard mask, a PMMA thickness of at least 52 nm would be required (the etch rate of PMMA is about 300 nm/min in this hard mask etching step), if no SIS modification were made. FIG. 13C shows clearly that a 53 nm PMMA film is not sufficiently thin to prevent pattern collapse. While much greater etch selectivity between PMMA and $SiO_2$ (or between Si and $SiO_2$) exists in industrial manufacturing tools, the improvement due to SIS-modification would make the entire fabrication process significantly more robust.

Figure 15A:
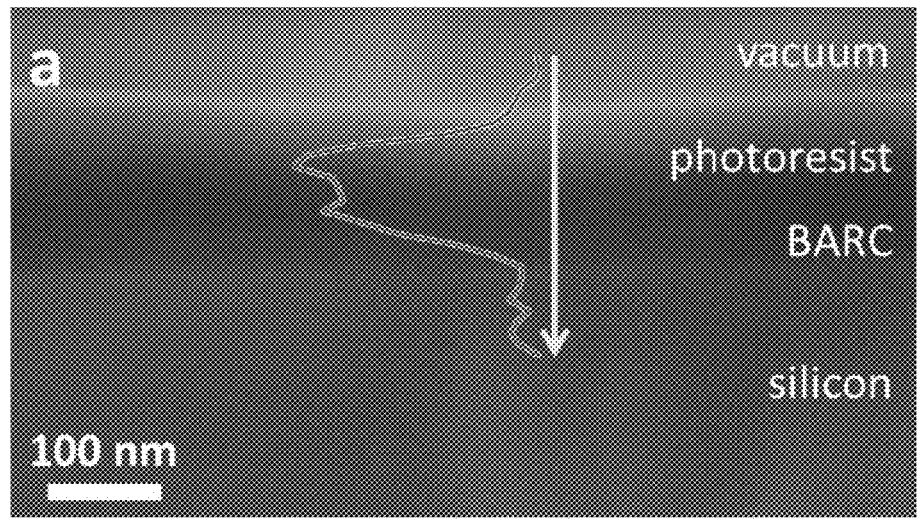
FIGS. 15A-B relate to an SIS-modified photoresist.
Figure 15B:
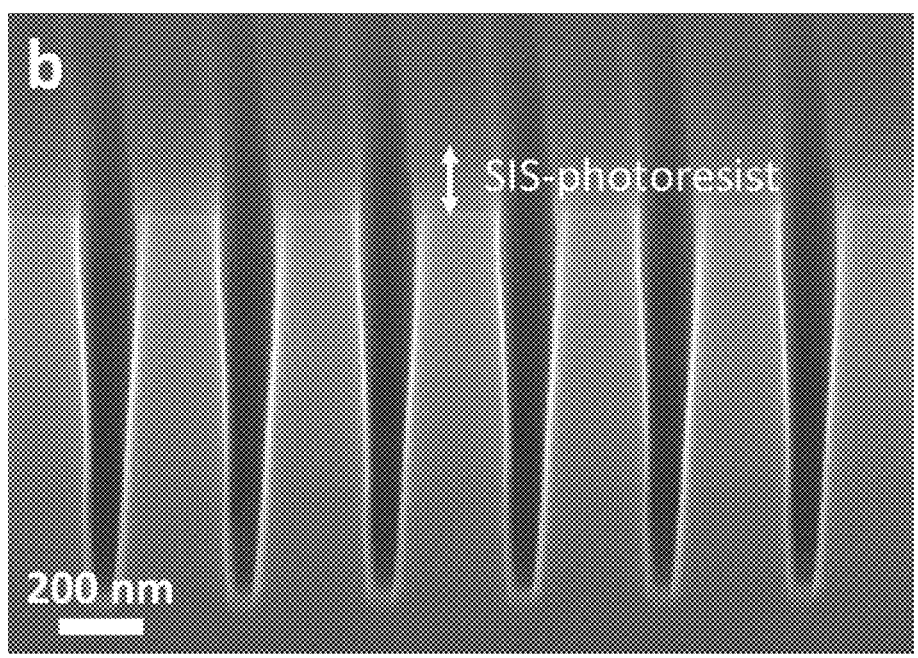

The results obtained above for PMMA are readily applicable to industrial 193 nm photoresists based on a similar polymer. FIGS. 15A and 15B show clearly the infiltration of $Al_2O_3$ and the corresponding increase in resistance to HBr-based plasma etching. The photoresist was patterned using established photolithographic and development processes, similar to that in use by industrial facilities. The SIS treatment enhanced the etch resistance of the photoresist by about 60-fold, decreasing the etch rate of the photoresist from ~230 nm/min to <4 nm/min, thus significantly improving its suitability as an etch mask.

The enhancement of a polymeric resist, namely poly (methyl methacrylate) (PMMA), via sequential infiltration synthesis (SIS), is a simple process for manufacturing dense and high-aspect ratio nanostructures. While PMMA is common for laboratory-scale experiments, it is also a major structural component of photoresists used in industrial 193 nm photolithography processes. They share similar chemical and mechanical properties. The results presented herein on PMMA are generally applicable to the broadly used 193 nm industrial photoresist, in regards to reactivity towards SIS precursors and pattern collapse. The etch resistance of thin PMMA films was enhanced to allow dense sub-20 nm features to be defined and transferred deeply into silicon substrates without the use of intermediate hard masks. The SIS process preserves the original pattern quality, as defined by line-edge roughness (LER), and provides a controllable degree of size-tunability. Furthermore, contrary to current industrial processes where LER is degraded by plasma etching, SIS allows the initial LER in the imaging layer to be preserved throughout plasma etching, with negligible change in the dimensions of the patterns. Importantly, the enhancement is sufficiently strong to allow a very thin PMMA film to be used, circumventing pattern collapse. The combination of reduced resist thickness and enhanced etch resistance allows dense and high aspect-ratio nanostructures to be created with simplicity and reliability unavailable in current manufacturing processes. Here PMMA is used as an example, but a vast array of other polymer chemistries are also compatible with SIS processing.

Figure 16A:
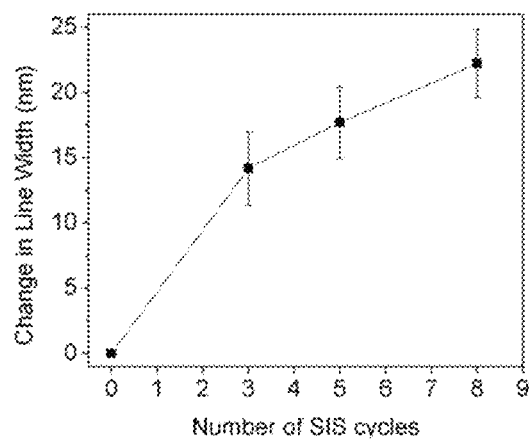
FIGS. 16A-C are graphs showing line characteristics as a function of SIS cycles.
Figure 16B:
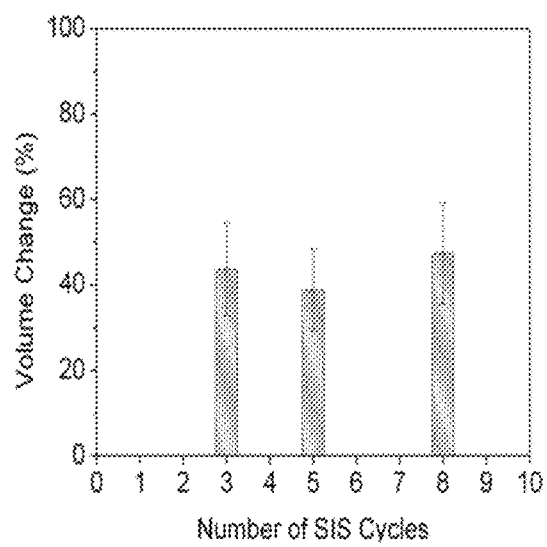

The process of infiltrating polymers with gaseous matter often leads to swelling. SIS modification of PMMA domains in PS-b-PMMA block copolymer may show evidence of such an effect, but the self-limiting property of SIS leads to dimension changes that are highly controllable by varying only the number of SIS cycles. For lithographically patterned PMMA features, FIG. 16A shows evidence of a change in lateral dimensions that is also highly controllable by the number of reaction cycles. Taking into account the change in film thickness, the volume expansion quickly reaches a constant level (FIG. 16B) within the error in metrology, and the changes in lateral dimensions become slower for a larger number of cycles. Most carbonyl reaction sites are saturated within the first few cycles, and it is likely that subsequent SIS reactions result instead in more thin film deposition on the resist pattern than pure SIS growth as the diffusion pathways become filled with alumina. For lithographic purposes, this dimensional control is highly desirable to ensure reproducible results.

Figure 16C:
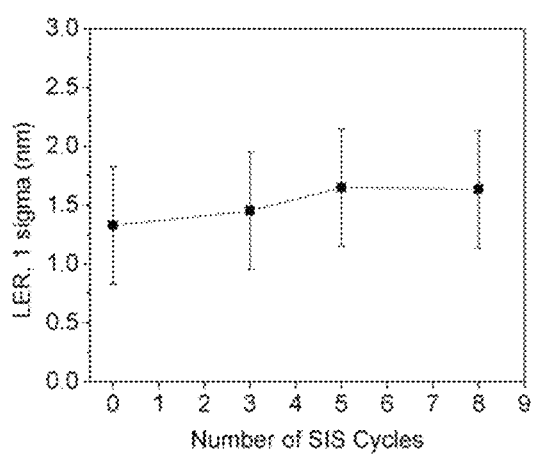

Generally, it is advantageous to minimize line-edge roughness (LER) of lithographic patterns. In silicon-based VLSI circuits, LER reduces carrier mobility, introduces significant device-to-device variations, and increases standby power consumption. In general, the LER of resist patterns immediately following development is the best that can be achieved at any point during the fabrication process, since plasma etching invariably causes severe degradation. The SIS modification preserves this optimal LER of as-patterned PMMA. FIG. 16C demonstrates that the line-edge roughness (LER) is unchanged by the SIS process for as many as eight reaction cycles. The LER of the initial PMMA lines has been minimized using cold development, and is comparable to or better than results reported in literature.

Figure 17A:
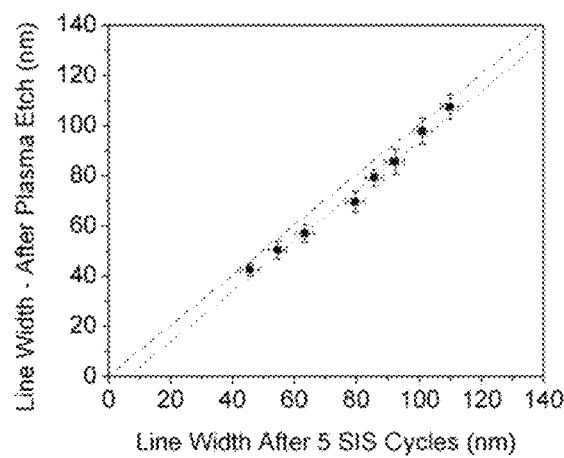
FIGS. 17A and 17B shows the effect of plasma etching on line width.
Figure 17B:
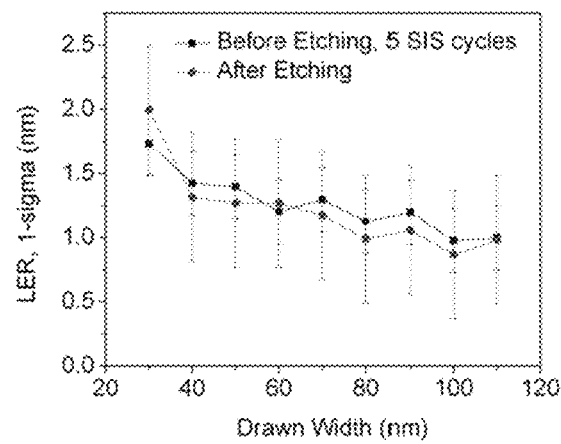

In many cases, the LER and dimensions of the SIS-modified resist patterns are preserved throughout the plasma etching process. Following a short $Al_2O_3$ breakthrough and plasma etching into silicon, the line dimensions and roughness are measured from SEM images. FIG. 17A shows that the line widths only reduce slightly, mainly due to the breakthrough step. As to the LER, it remains unchanged after the main etching step (FIG. 17B), for all line widths down to 30 nm. These results are marked improvements over industrial processes, where the LER degrades significantly due to erosion of the resist during plasma etching. Although the LER of lines etched into the substrate material can improve with continued etching, the roughness of the resist pattern is never completely removed. The enhanced etch resistance via SIS modification demonstrated herein presents a simple solution to this important technological challenge.

Collapse of high-aspect-ratio resist structures during wet development is an important problem. As stated in the International Technology Roadmap for Semiconductors, this problem has no known manufacturable solution for the next decade. In a limited number of applications, such as zone plates for x-ray microscopy, pattern collapse is mitigated by using buttresses between adjacent lines. However, this solution is not applicable to arbitrary patterns. A simple way to prevent pattern collapse is to reduce the resist thickness in order to decrease the aspect-ratio of resist structures. The reduction of resist aspect-ratio after the SIS process is effective in preventing pattern collapse. FIG. 13A-D show that the reduction of resist aspect-ratio is effective in preventing pattern collapse. Using a resist aspect-ratio of 1 (FIG. 13D), followed by SIS enhancement, the structures in FIG. 14 can be fabricated easily: dense lines, narrower than 20 nm, and deeply etched into the silicon substrate were made using SIS-modification of a mere 30 nm-thick PMMA resist film. For comparison, if a $SiO_2$ intermediate hard mask were used, the etch depth of 130 nm shown in FIG. 14 would have required a minimum $SiO_2$ thickness of ~5 nm, using a typical $Si:SiO_2$ selectivity of 25:1 for HBr-based etch chemistry. To fully etch through the $SiO_2$ hard mask, a PMMA thickness of at least 52 nm would be required (the etch rate of PMMA is about 300 nm/min in this hard mask etching step), if no SIS modification were made. FIG. 13C shows clearly that a 53 nm PMMA film is not sufficiently thin to prevent pattern collapse. While much greater etch selectivity between PMMA and $SiO_2$ (or between Si and $SiO_2$) exists in industrial manufacturing tools, the improvement due to SIS-modification would make the entire fabrication process significantly more robust.

The results obtained above for PMMA are readily applicable to industrial 193 nm photoresists based on the same polymer. FIGS. 15A and 15B show clearly the infiltration of $Al_2O_3$ and the corresponding increase in resistance to HBr-based plasma etching. The photoresist was patterned using established photolithographic and development processes, similar to that in use by industrial facilities. The SIS treatment enhanced the etch resistance of the photoresist by about 60-fold, decreasing the etch rate of the photoresist from ~230 nm/min to <4 nm/min, thus significantly improving its suitability as an etch mask.

Therefore, SIS-enhanced imaging layers may be used in high resolution patterning and plasma etching techniques for various applications. Although not bound by theory, the SIS process is understood to not cause uncontrolled size change, nor does it introduce additional degradation to lithographically defined patterns. The SIS process is also understood to prevent pattern degradation during plasma etching. Furthermore, the improved etch resistance allows pattern collapse to be circumvented during wet development, allowing arbitrary nanostructures with high aspect-ratio to be generated with great simplicity. Taken together, these properties may meet the requirements for resist thickness on the International Technology Roadmap for Semiconductors for a decade in the future.

In addition to SIS-modification of various conventional organic resist materials, SIS-modification may also be used with resist materials comprising block copolymers for bottom up design of mask layers. Block copolymers are molecules composed of two or more polymers connected with covalent bonds. For example, polystyrene-block-poly (methyl methacrylate) (PS-b-PMMA) is composed of polystyrene (PS) and poly(methyl methacrylate) (PMMA) covalently linked. By varying the preparation conditions of the block copolymer, these blocks will phase-separate and self-organize into structures with ordered nanoscale domains in various configurations such as spheres, cylinders, or lamellae. The characteristic shape and dimensions of these domains can be tuned via polymeric design.

In an embodiment, a block copolymer resist material is SIS-modified by alternately exposing the resist material to two or more gas phase precursors. Like the techniques applied to other organic resist materials described above, the first precursor may be a metal precursor that is selectively reactive with a functional group present in one of the polymer units, i.e., a first polymer, but which is absent from at least one of the other polymer units in the block copolymer, i.e., a second polymer. The metal precursor selectively binds to the functional group (the reactive functional group) but is substantially non-reactive with one or more other polymers that compose the block copolymer. The metal precursor is substantially non-reactive when the precursor does not bind to the second polymer under the reaction that defines the SIS process. As previously described, the second precursor is selectively reactive with the first precursor (or portion thereof) that is bound to the first polymer unit.

In general, in a material having the correct chemical termination, the SIS modification process results in the growth of an inorganic compound, i.e., the protective component, associated with the selected precursors. For example, $Al_2O_3$ may be formed within a portion of the block copolymer (BCP) using a TMA precursor and a water precursor. However, in portions of the BCP where the appropriate chemical termination is absent, the growth will be substantially inhibited. By selecting precursors that selectively react with only one of the BCP units, the process will result in growth within that polymer component only, while substantially excluded from the other.

For example, SIS modification of a BCP of PS-b-PMMA using TMA and water precursors results in growth of inorganic $Al_2O_3$ almost exclusively within the PMMA component, to the exclusion of the PS component. The PS-b-PMMA material is exposed to a vapor of a metal or metal-containing precursor, which diffuses into the BCP film and selectively reacts specifically with carbonyl groups in the PMMA domains. The non-coordinated excess metal precursor may be removed from the domain via a purge step such as with high purity $N_2$ to prevent or minimize non-self-limited, homogeneous reactions. The PS-b-PMMA material is then exposed to a reactant precursor such as water, which reacts with the coordinated metal precursor to form the inorganic protective component. The precursors infiltrate molecular-scale voids in the block copolymer substrate and attach to the polymer chains to form an inorganic-organic hybrid composite material. For example, TMA will react with the oxygen species in the PMMA component but not with the PS, which is comprised solely of carbon and hydrogen. An inorganic feature, in this case $Al_2O_3$, substantially assumes the same ordered nanostructure/spacing as the block copolymer. Thus, the protective component selectively grows within the PMMA microdomains. The width of individual domains can be further tuned by modulating the number of SIS cycles. After SIS-modification, the substrate may be etched, consistent with the etching processes previously described. The microdomains of PS-b-PMMA are transferred to the substrate, with the modified PMMA portion of the resist layer having a significantly greater etch resistance than the unmodified PS portion.

In light of the broad range of selective chemistries between various suitable metal precursors and polymer units as well as the enormous library of block copolymers, patterned functional materials could be synthesized onto a broad range of substrates. The process is applicable to SIS modification with a broad range of inorganic materials, including metals, metal oxides, metal nitrides, metal sulfides, and metalloid materials. The process may be generalized to designing the desired block copolymers in terms of materials and micro-domain configuration (e.g., shape and dimensions) and selecting corresponding precursors reactively compatible with the appropriate polymer units and characterized by the desired final material properties (e.g., etch resistance, electronic and/or photo response).

For example, ZnO, $TiO_2$, and W growth may be grown exclusively within the PMMA unit of PS-b-PMMA via selective reaction with the carbonyl chemistry of the PMMA component of the BCP. However, the precursors associated with these materials are non-reactive with the PS component of the BCP, which has no carbonyl groups. The SIS-infiltrated inorganic material assumes the self-assembled, periodic nanostructure of the PMMA within the BCP substrate. Thus, an inorganic material is selectively nanopatterned and an organic/inorganic hybrid composite material is formed. The resulting structure may be advantageously applied in various pattern transfer to substrate processes such as plasma etching or ion milling.

Although carbonyl functional groups are described as one example of a polymer component that may be utilized for selective inorganic material growth, a variety of different polymer units are available to interact with various metal and metal-containing precursors through various interactions, including metal-ligand coordination, covalent bonding, and other interactions. For example, the pyridine groups in polyvinylpyridine, a common block of BCPs, could be used to selectively bind various metal-containing precursor compounds including $Al(CH_3)_3$, $AlCl_3$, $ZnCl_2$, $CdCl_2$, etc. Additionally, hydroxyl groups provided by polyacrylic acid, another common block for BCPs, could react with various metal precursors, including $Al(CH_3)_3$, $TiCl_4$, $Zn(C_2H_5)_2$, etc., to form covalent bonds.

Two components are significant in driving the present processes to obtain particular material characteristics. The first component is the selective reaction of a metal precursor such as $TiCl_4$, $SnCl_4$, $AlCl_3$, $Al(CH_3)_3$, etc., which are Lewis acids in this example, with strategically selected functional moieties in the BCP such as the carbonyl groups in PMMA microdomains. Once bound to the polymer, the grafted metal-ligands serve as nucleation sites for the second component. Within each of these components, the reactions are controllable on the molecular level and the characteristic self-limited heterogeneous reactions provide macroscopic uniformity in principle.

Polystyrene-block-poly(methyl methacrylate) (PS-b-PMMA, $M_W$=50,500/20,900) (Polymer Source, Inc.) was purified through Soxhlet extraction to remove excess PS homopolymer. BCP solutions were prepared in toluene (Fisher, 99.5%) with a concentration of 13 mg/mL. The $PS_{485}$-b-$PMMA_{201}$ block copolymer scaffold features were prepared by spin coating from a toluene solution onto cleaned silicon scaffolds with native $SiO_2$. After deposition, PS-b-PMMA features were annealed at 250° C. for two hours in a tube furnace under a flowing Ar atmosphere, then cooled to room temperature to obtain self-assembled patterns. The in-plane PMMA cylinders were 30±3 nm in diameter, and the center-to-center lateral distance was 60±5 nm. These dimensions can be varied by adjusting the molecular weight of the constituent polymer blocks.

The $Al_2O_3$ SIS process was performed using the SIS timing sequence: 60/300/60/300 seconds, where the times represent the first metal precursor trimethyl aluminum (Al($CH_3)_3$ TMA 96%) exposure, inert purge, second co-reactant precursor (water) exposure, and inert purge, respectively. Ultrahigh purity $N_2$ (99.999%) was used as the purge gas and carrier gas with further purification by an inert gas filter (Aeronex Gatekeeper) before entering the reactor. All precursors were introduced into the ALD reactor at room temperature vapor. In order to remove moisture and achieve thermal equilibrium, the samples were subjected to a 300 sccm $N_2$ flow at 1 Torr for at least 30 minutes and then evacuated to less than 20 mTorr before commencing SIS.

Figure 11:
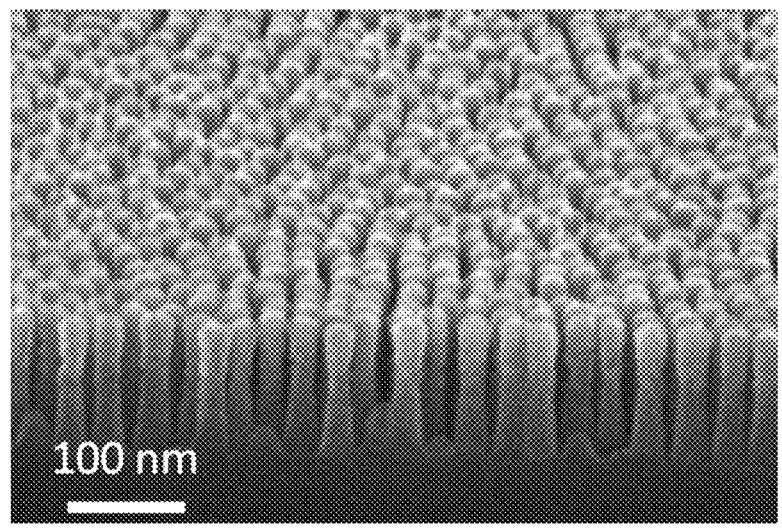
FIG. 11 is an SEM image of patterned nanoscale cylinders in a Si substrate prepared by etching a self-assembled PS-b-PMMA block copolymer resist layer with the PMMA component SIS-modified with SIS-$Al_2O_3$.

FIG. 11 depicts a plurality of patterned nanoscale cylindrical features prepared by etching a Si substrate with a SIS modified self-assembled PS-b-PMMA resist layer. The PS-b-PMMA resist layer comprises a plurality of orientated PMMA microdomains. The PS-b-PMMA resist layer (without intermediate hard mask) was SIS-modified with $Al_2O_3$ to improve etch resistance of the PMMA component. After etching, the SEM image shows the Si substrate patterned with a plurality of tall cylinders with diameters of about 30 nm formed in response to the ordered microdomains of the SIS-modified PMMA.

Figure 12A:
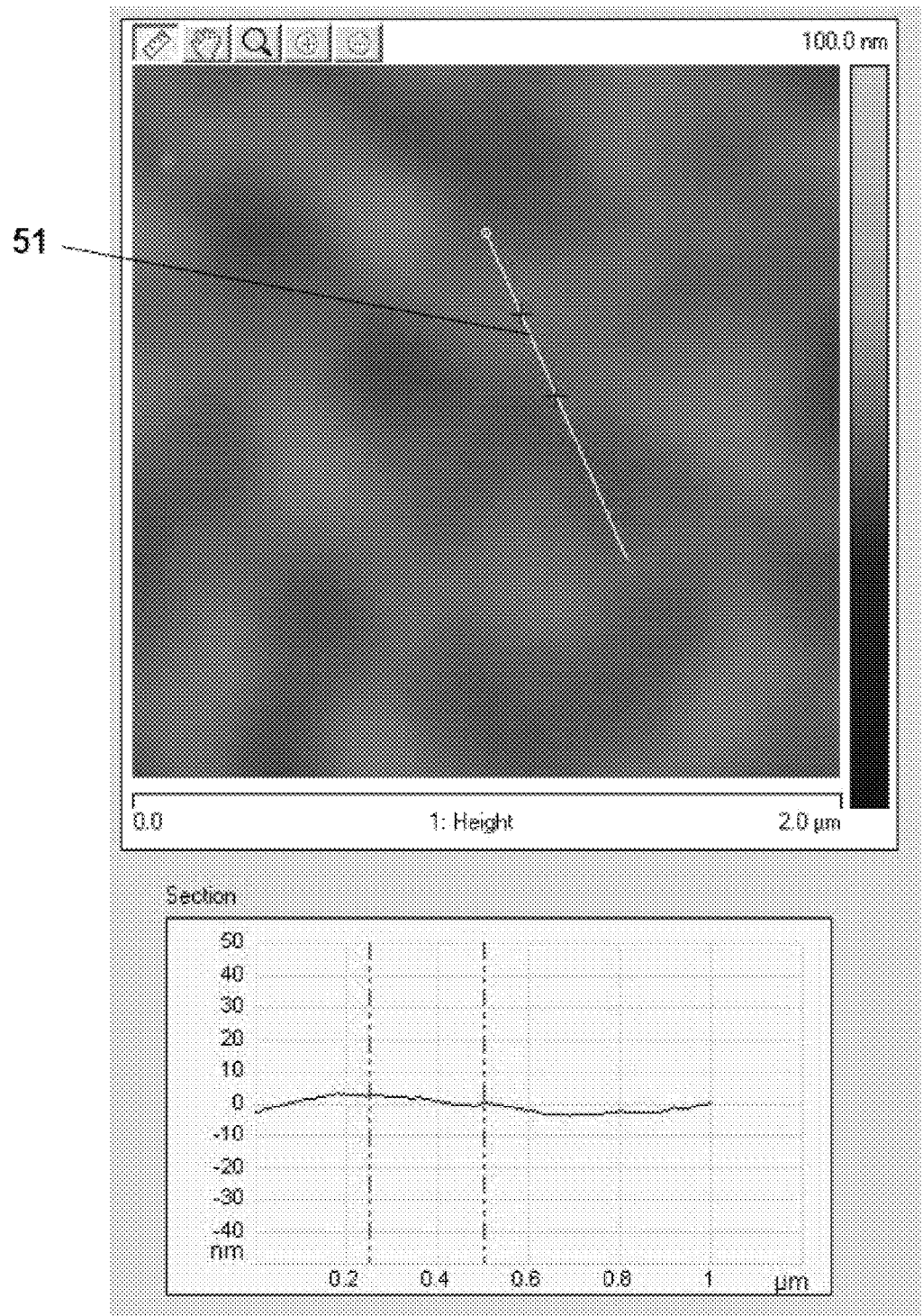
FIGS. 12A-12C are AFM images (upper portion) and AFM line scandata for an ITO substrate with a PS-b-PMMA copolymer resist layer prior to etching (FIG. 12A); after a two-minute plasma etch (FIG. 12B); and after a two-minute plasma etch of a SIS-modified (with SIS-$Al_2O_3$) PS-b-PMMA copolymer resist layer (FIG. 12C).
Figure 12B:
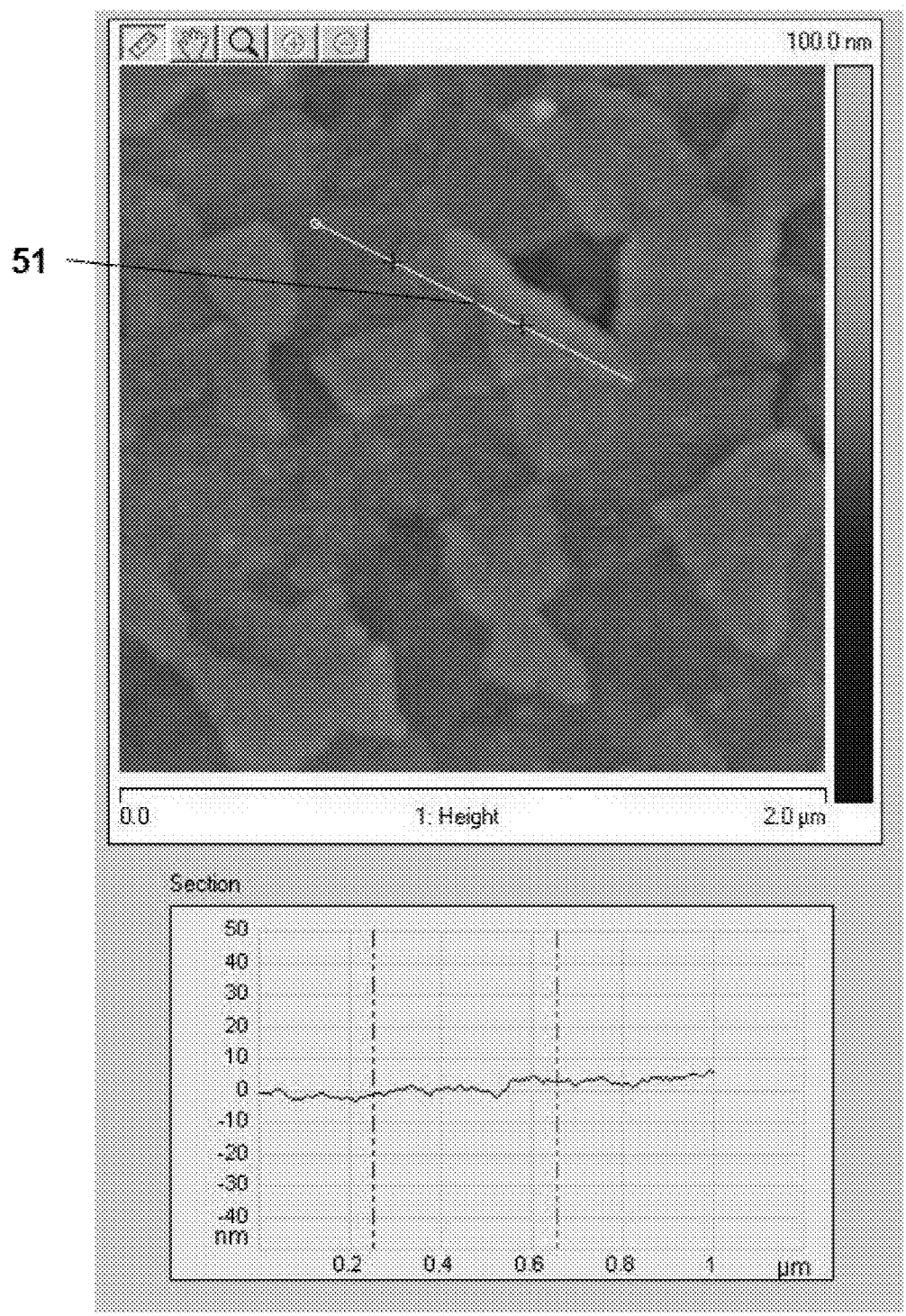
Figure 12C:
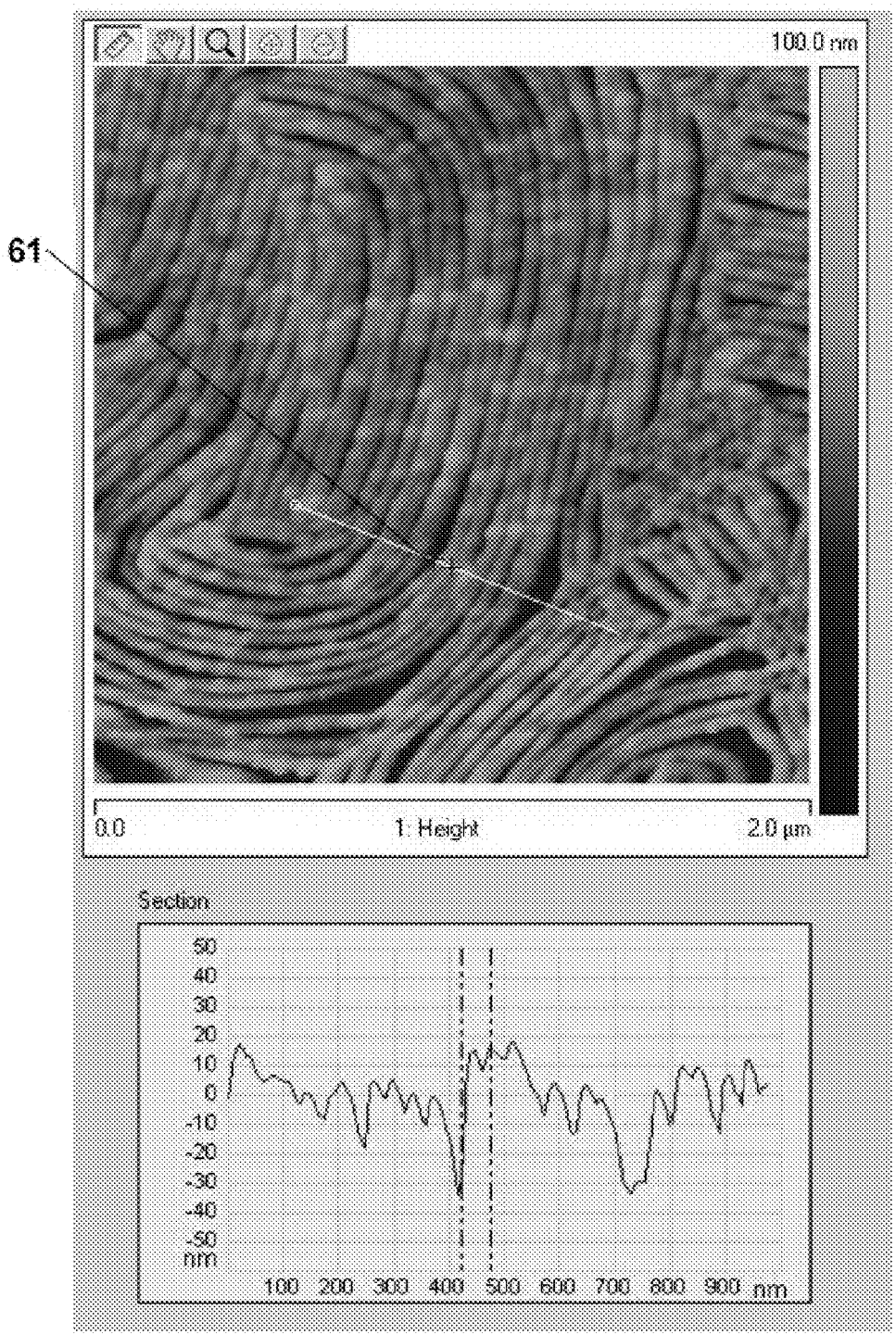

FIGS. 12A-12C show AFM images (upper portion) and corresponding atomic force microscopy (AFM) line scan data (lower portion) for an indium tin oxide (ITO) substrate patterned with a PS-b-PMMA resist layer. FIG. 12A shows an ITO substrate and unmodified resist layer prior to etching. The AFM data taken along the path 51 illustrated in the AFM image show a substantially smooth surface with little change in elevation. FIG. 12B shows an ITO substrate after a two-minute plasma etch using an unmodified PS-b-PMMA resist layer. The AFM data show surface roughness has marginally increased but with little change in surface elevation. The AFM data also show very little change in the surface morphology relative to unprocessed ITO film. FIG. 12C shows an ITO substrate after a two-minute plasma etch using a PS-b-PMMA resist layer SIS-modified with $Al_2O_3$. On the other hand, the SEM image and corresponding AFM data show the patterned ITO substrate and significant surface elevation changes with troughs exceeding 30 nm.

It is understood that the techniques described in this disclosure may be utilized in various applications. Although lithography and plasma etching were initially developed for the microelectronics industry, they have become essential to other technologies, such as micro-electro-mechanical and microfluidic systems. Indeed, the physical realization of any system with nanoscale components requires a certain degree of top-down patterning. In lithography, an imaging layer (resist) sensitive to light or electrons is exposed to the image of a fine pattern and developed in wet chemicals. Plasma etching is then used to transfer the pattern in the imaging layer to a material of interest. These procedures are then repeated many times to complete a functional system.

Figure 18A:
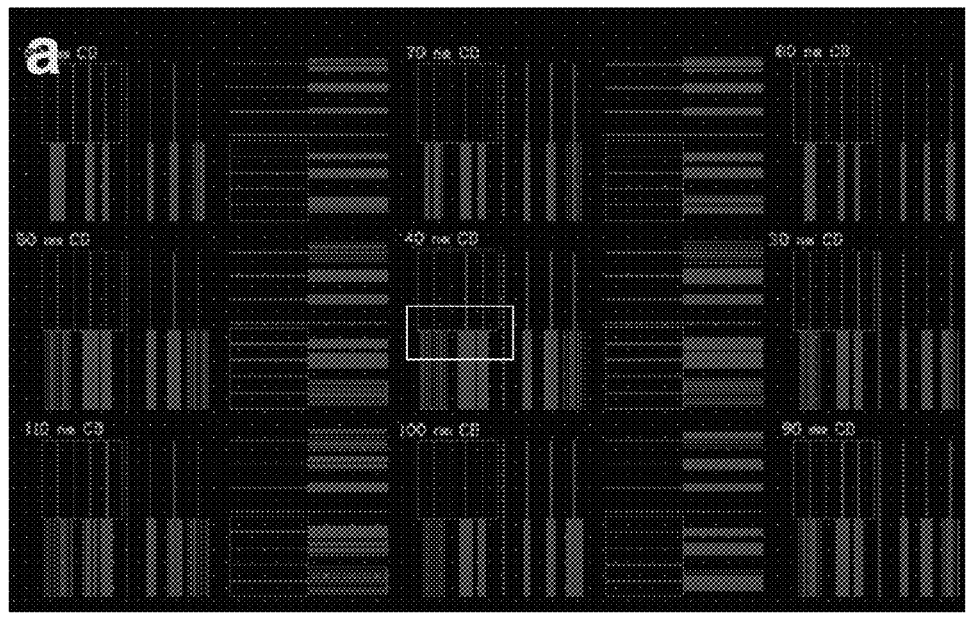
FIGS. 18A and 18B show an example test pattern that can be used.
Figure 18B:
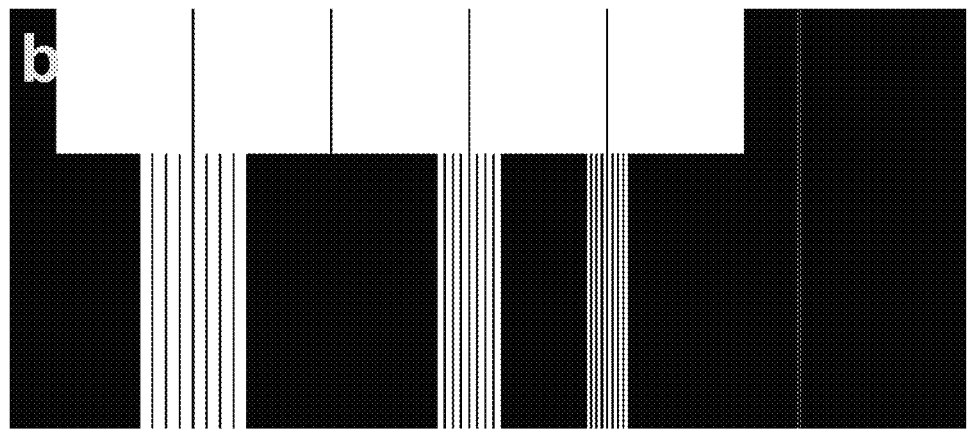
Figure 21A:
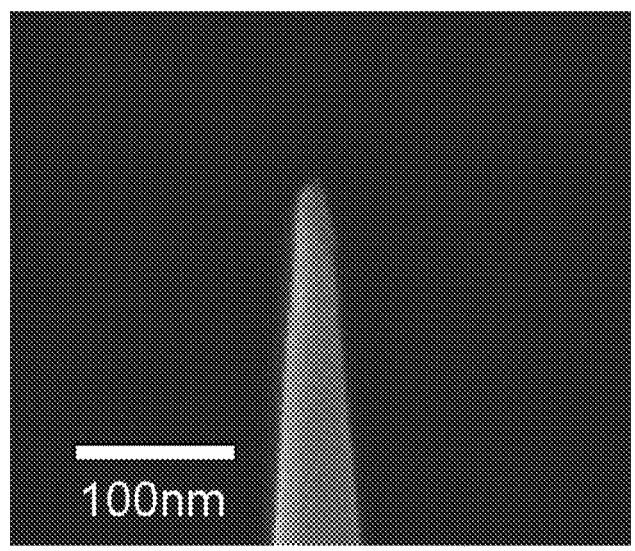
FIGS. 21A-C show methodology used to determine line width and line edge roughness using AFM.
Figure 21B:
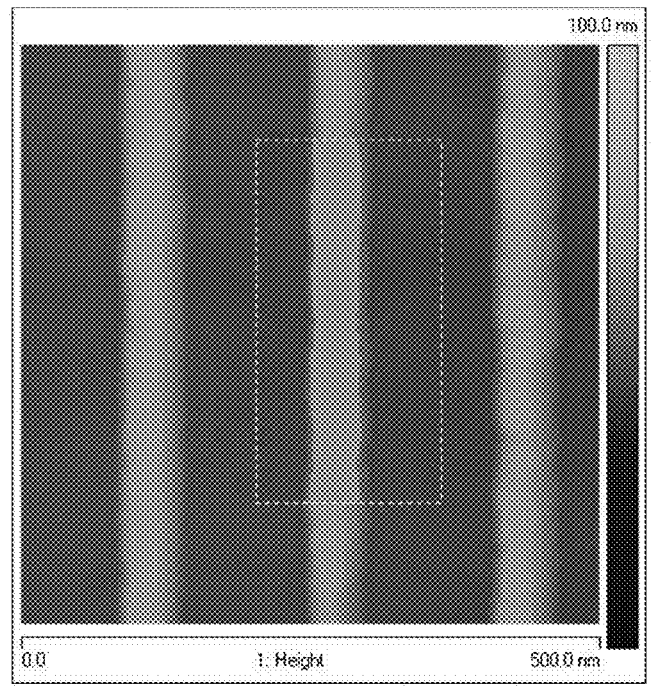
Figure 21C:
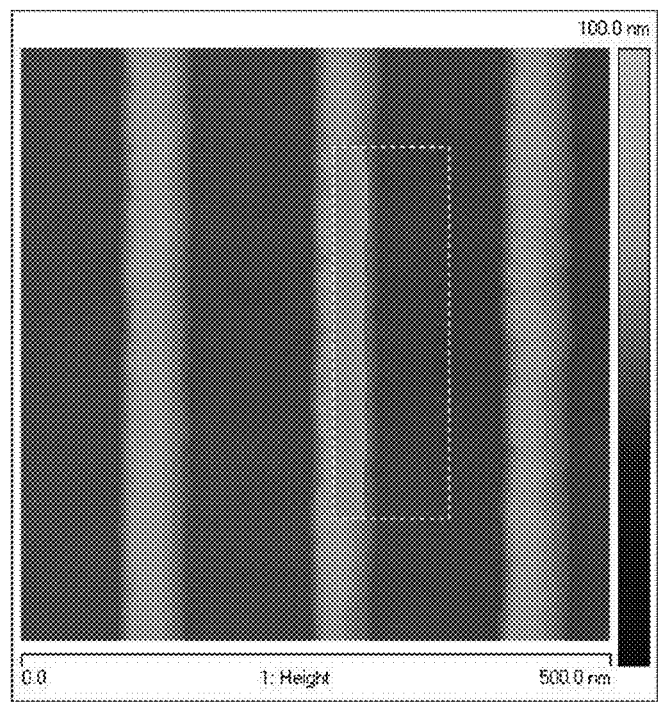

Methodology:

In this disclosure, the line widths and line-edge roughness (LER) were measured using atomic force microscopy (AFM) or scanning electron microscopy (SEM) where appropriate. The lines measured were patterned in 30 nm-thick PMMA and were widely spaced (line/space ratio: 0.25) to allow the AFM tip to reach the substrate as shown in FIG. 18. The AFM tip that was used in the experiments may be approximately 5 nm. FIGS. 21A, B and C show the methodology for determining line width and line edge roughness using AFM.

Figure 19A:
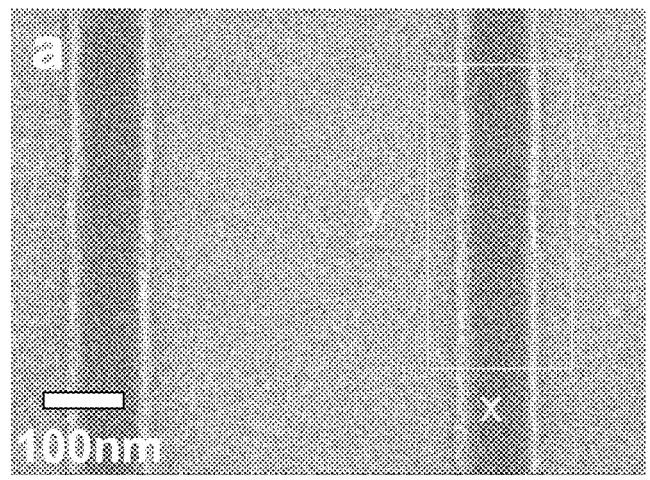
FIGS. 19A-B shows the methodology for extracting line width from SEM images.
Figure 19B:
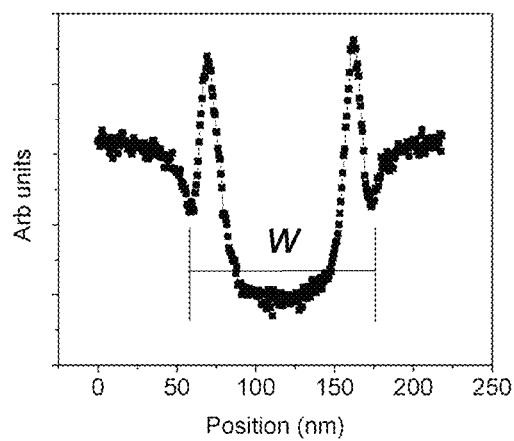

To examine the effects of SIS-treatment, line widths and LER were measured from as-patterned and SIS-treated PMMA patterns using high-aspect ratio AFM tips. AFM was used for metrology in this case because untreated PMMA can be considerably damaged in SEM. In the AFM measurements, the line widths are taken as the average width at 50% of the vertical distance from the top of the resist surface using the image analysis software (Veeco, Nanoscope version 7.3). Line edge roughness (LER) was w as shown in FIG. 19B. The "Width" function and the "Highest Peak" is used a reference, and the line edge is defined as the position where the topography height is 50% of the full resist thickness.

Figure 20A:
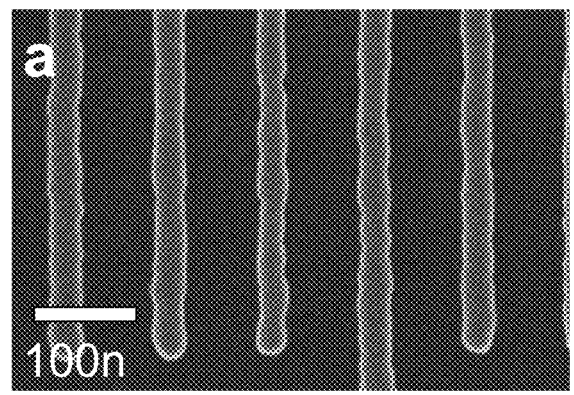
FIGS. 20A-C show the methodology for extracting 1-sigma LER from SEM images.
Figure 20B:
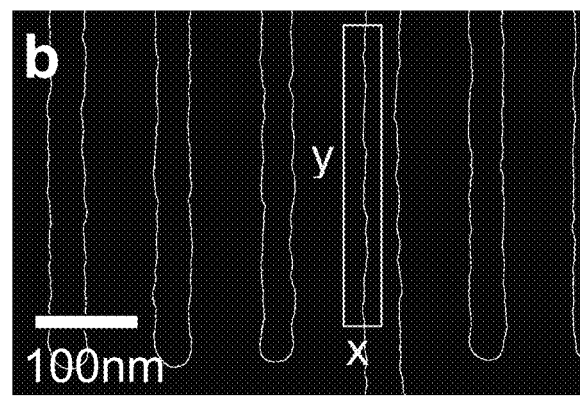
Figure 20C:
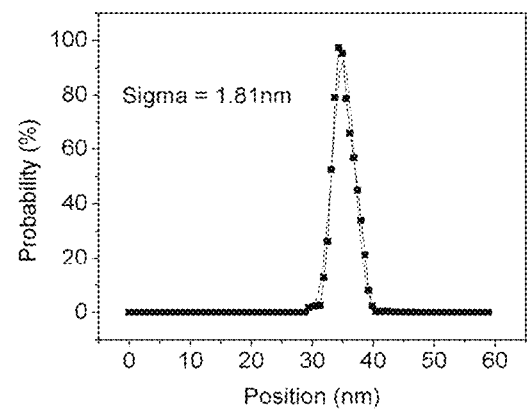

To examine the effects of plasma etching, line widths and LER were measured by SEM on SIS-treated samples before and after plasma etching. SEM was chosen in this case since SIS-treated PMMA did not become damaged during SEM examination and because it provided high spatial resolution. Line widths and LER were extracted from SEM images using ImageJ (NIH) as shown in FIGS. 20A-C. The standard deviation (sigma) of the Gaussian fit gives the LER (as shown in FIG. 20C). A white pixel is assigned a value of '1', whereas a black pixel is '0.' The grey-scale average gives the probability that a pixel is white at a given position x, matching the definition of LER.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of preparing an organic resist mask by sequential infiltration synthesis (SIS) for use in forming at least one patterned feature in a substrate material by an etching or milling process, comprising:
   applying an organic resist mask layer to a substrate, the organic resist mask layer characterized by an etch resistance;
   patterning the organic resist mask layer with at least one patterned feature; and
   forming an inorganic protective etch component within the organic resist mask layer by exposing the organic resist mask layer to a plurality of SIS cycles comprising alternating cycles of:
      reacting a first precursor reactive with the organic resist;
      reacting a second precursor with the first precursor within the organic resist;
   thereby increasing the etch resistance of the organic resist mask layer with respect to the etching or milling process, wherein the etch resistance of the organic resist mask layer is selectively controllable by establishing an infiltration depth of the inorganic protective etch component such that the at least one patterned feature has an aspect ratio of at least 1:1.

2. The method of claim 1, wherein the first precursor and the second precursor comprise gas phase precursors.

3. The method of claim 2, wherein the first precursor comprises a metal or metal containing compound, and wherein the inorganic protective etch component comprises a metal oxide or a metal.

4. The method of claim 3, wherein the inorganic protective etch component comprises metal oxide is selected from the group consisting of $Al_2O_3$, $ZnO$, $SiO_2$, $HfO_2$, $ZrO_2$ and $TiO_2$.

5. The method of claim 1, wherein the organic resist mask layer comprises at least one of poly(methyl methacrylate) (PMMA), ZEP520A, poly(methyl glutarimide) (PMGI), phenol formaldehyde resin (DNQ/Novolac), polyhydroxystyrene-based polymers, polyimides and SU-8.

6. The method of claim 1, further comprising forming the at least one patterned feature in the substrate material by performing a plasma etching or ion milling process following modification of the etch resistance of the organic resist mask layer.

7. The method of claim 6, wherein the plasma etching process is defined by a plurality of etching steps performed in order, comprising:
   a first etching step configured to break through the protective etch component;
   a second etching step configured to break through a layer comprising an oxide of the substrate material; and
   a third etching step configured to etch the at least one patterned feature in the substrate.

8. The method of claim 1, wherein the patterned feature of the organic resist mask layer is prepared by photolithography.

9. The method of claim 1, wherein the patterned feature of the organic resist mask layer is prepared by electron beam lithography.

10. A method of plasma etching a patterned feature in a substrate material without a hard mask using an organic resist mask layer modified by sequential infiltration synthesis (SIS), comprising:
    providing a substrate material;
    applying the organic resist mask layer over a surface of the substrate material, the organic resist mask layer having a layer thickness and comprising a first organic material;
    forming the patterned feature in the organic resist mask layer by lithography;
    modifying the plasma etch or ion milling resistance of the organic resist mask layer having the patterned feature by performing a plurality of SIS cycles, comprising:
       exposing the organic resist mask layer to a first precursor reactive with the first organic material; and
       exposing the organic resist mask layer to a second precursor to form a protective etch component within at least a portion of the first organic material; and
    performing a plasma etching or ion milling process that etches the patterned feature in the substrate material to a feature depth,
    wherein the modified organic resist mask layer is characterized by a modified plasma etch or ion milling resistance greater than the initial plasma etch or ion milling resistance.

11. The method of claim 10, wherein the first organic material comprises PMMA or ZEP520A and the protective etch component comprises a metal oxide.

12. The method of claim 11, wherein the substrate material comprises Si.

13. The method of claim 11, wherein the modified plasma etch resistance is selectively controllable by performing a predetermined number of SIS cycles.

14. The method of claim 10, wherein the patterned feature on the organic resist mask layer is prepared by photolithography.

15. The method of claim 10, wherein the patterned feature of the organic resist mask layer is prepared by electron beam lithography.

16. The method of claim 10, wherein the feature depth is between about 5 and 10 times the layer thickness.

17. The method of claim 10, wherein the organic resist mask layer comprises a block copolymer, and wherein the first precursor is substantially non-reactive with at least one block of the block copolymer.

18. The method of claim 17, wherein the block copolymer comprises nanostructured polystyrene-block-poly (methyl methacrylate) (PS-b-PMMA).

19. The method of claim 10, wherein the plasma etching process is defined by a plurality of etching steps performed in order, comprising:
- a first etching step configured to break through the protective etch component;
- a second etching step configured to break through a layer comprising an oxide of the substrate material; and
- a third etching step configured to etch the patterned feature in the substrate material to the feature depth.

20. The method of claim 19, further comprising removing a remaining portion of the organic resist mask layer from the surface of the substrate material.

* * * * *